United States Patent [19]
Toyosawa et al.

[11] Patent Number: 6,011,315
[45] Date of Patent: Jan. 4, 2000

[54] SEMICONDUCTOR DEVICE AND FILM CARRIER TAPE AND RESPECTIVE MANUFACTURING METHODS THEREOF

[75] Inventors: Kenji Toyosawa, Ikoma; Mitsuaki Ohsono, Sakurai, both of Japan

[73] Assignee: Sharp Kabushiki Kaisha, Osaka, Japan

[21] Appl. No.: 08/942,481

[22] Filed: Oct. 2, 1997

[30] Foreign Application Priority Data

Dec. 13, 1996 [JP] Japan ..................... 8-334326

[51] Int. Cl.[7] .......................... H01L 23/48; H01L 23/52; H01L 29/40
[52] U.S. Cl. ..................... 257/783; 257/782; 257/668
[58] Field of Search .................... 257/782, 783, 257/778, 668, 787, 789

[56] References Cited

U.S. PATENT DOCUMENTS

| | | | |
|---|---|---|---|
| 4,811,081 | 3/1989 | Lyden | 257/783 |
| 5,641,997 | 6/1997 | Ohta et al. | 257/789 |
| 5,659,198 | 8/1997 | Okutomo et al. | 257/668 |
| 5,767,572 | 6/1998 | Fujitsu | 257/668 |
| 5,814,879 | 9/1998 | Ishisaka et al. | 257/668 |

FOREIGN PATENT DOCUMENTS

| | | |
|---|---|---|
| 63-160239 | 7/1988 | Japan . |
| 7-161765 | 6/1995 | Japan . |
| 7-169795 | 7/1995 | Japan . |

*Primary Examiner*—Sheila V. Clark
*Attorney, Agent, or Firm*—Nixon & Vanderhye P.C.

[57] ABSTRACT

A semiconductor device is arranged so that a semiconductor chip is mounted on a film carrier which is composed of (1) an insulating base material tape having an opening section and (2) a conductive wiring having inner leads electrically connected to the semiconductor chip in the opening. The conductive wiring is provided on a main surface of the insulating base material tape. The film carrier is provided with an organic insulating film, which is different from the conductive wiring, covering the conductive wiring and the inner leads so as to support the inner leads.

20 Claims, 20 Drawing Sheets

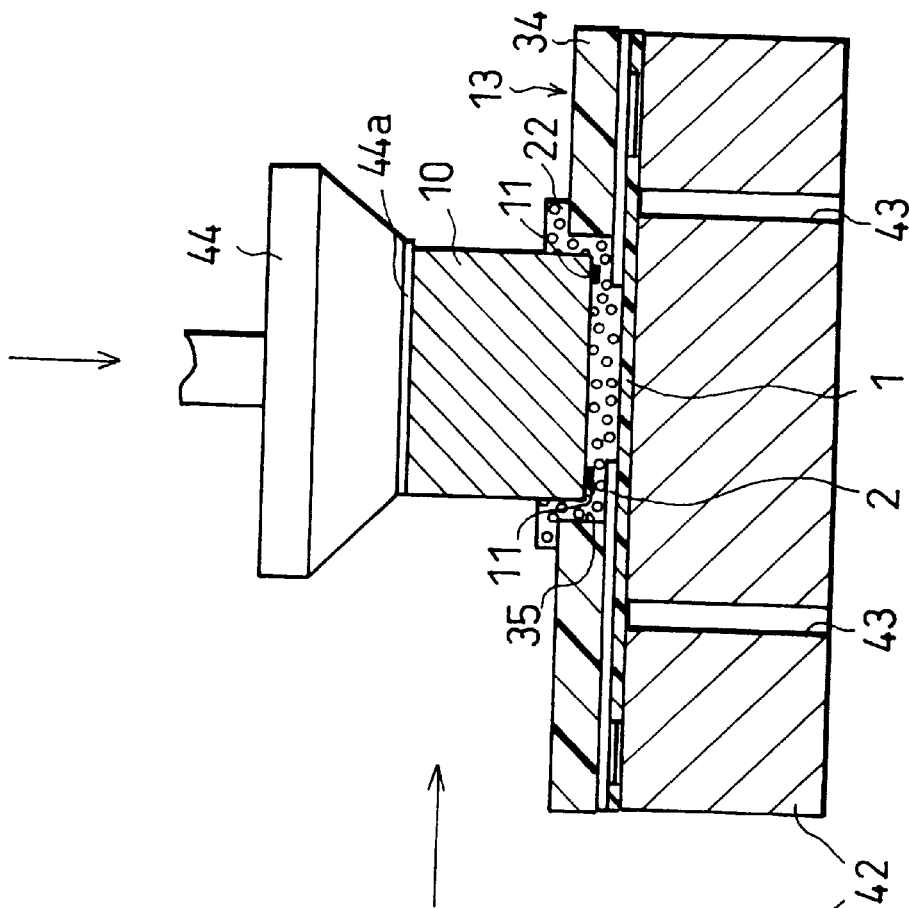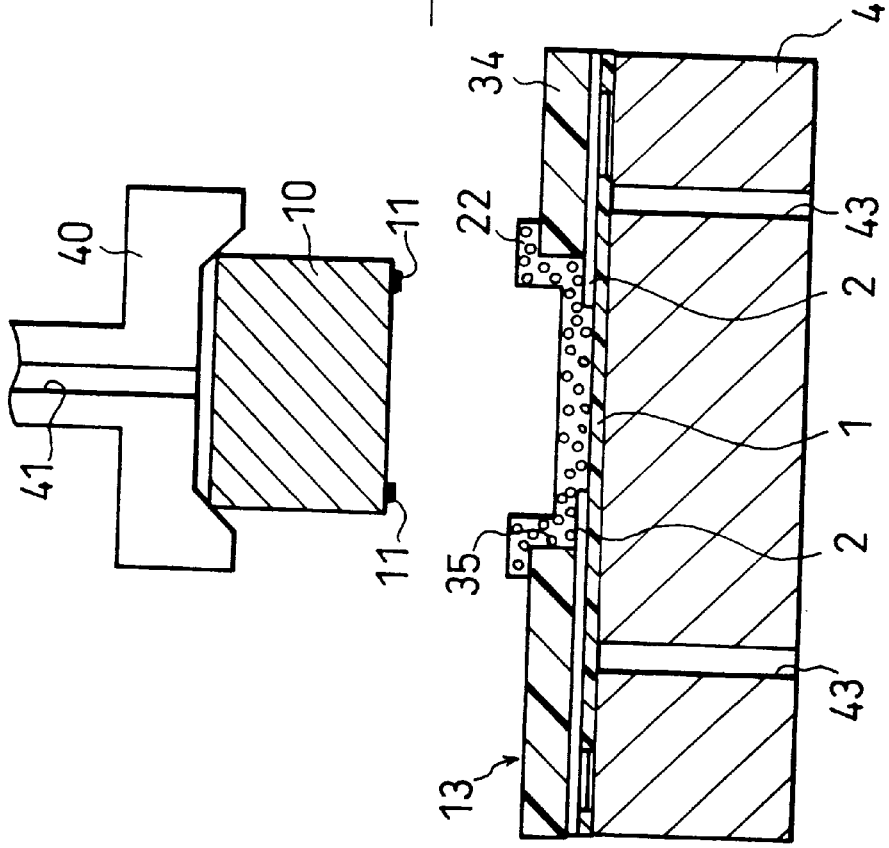

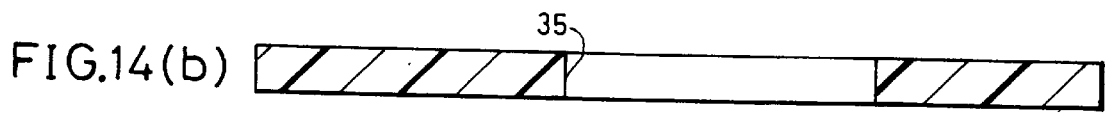
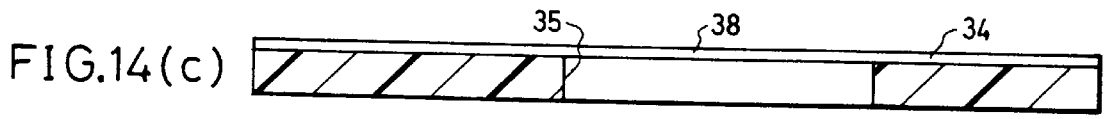
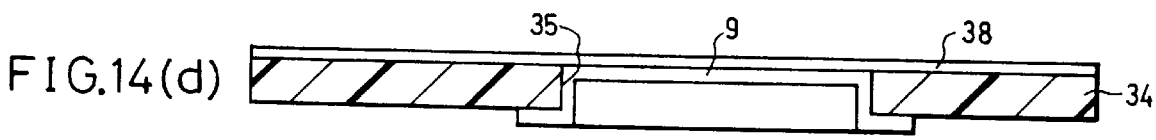
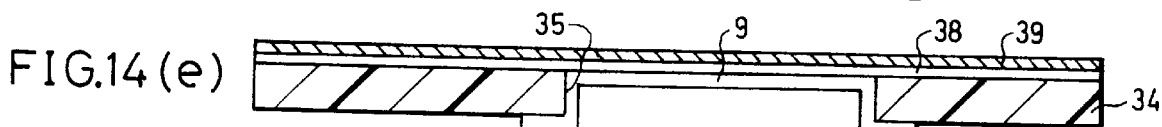
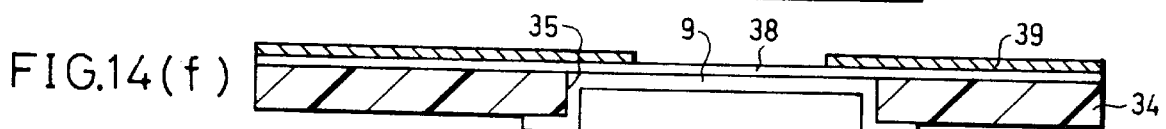
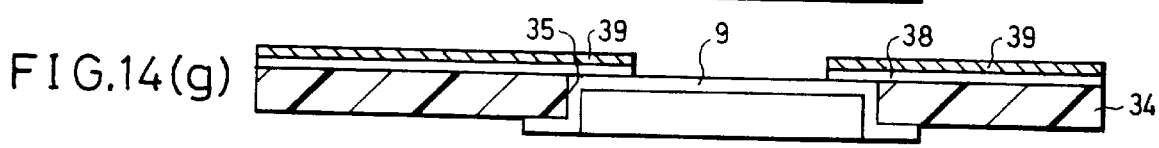
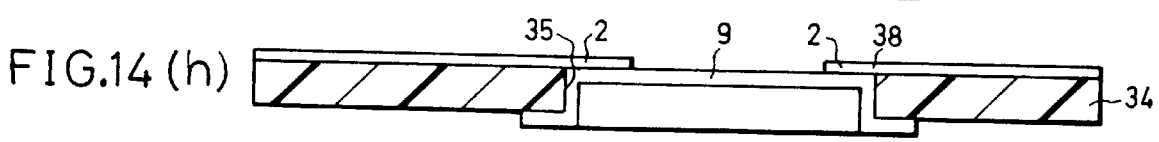
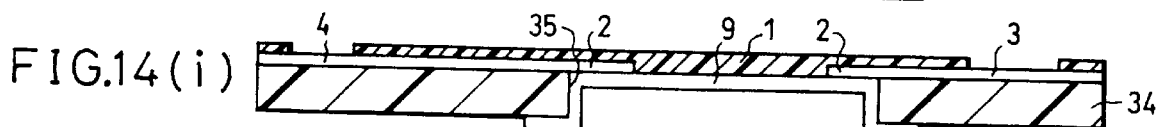
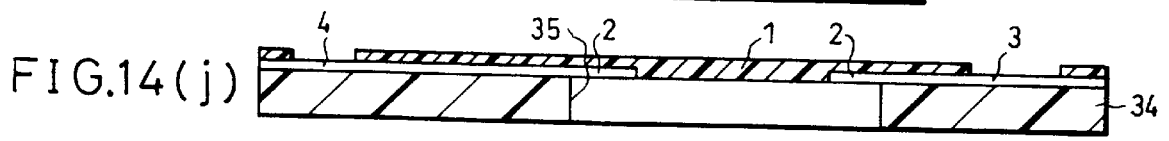
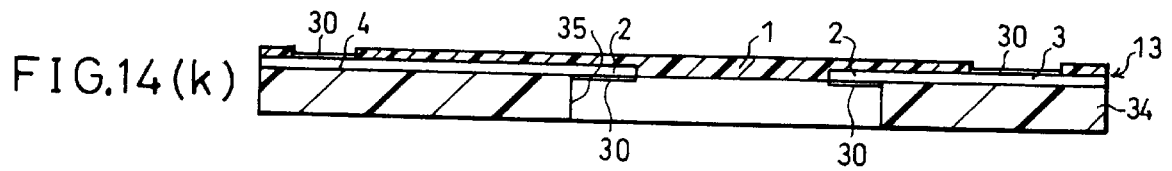

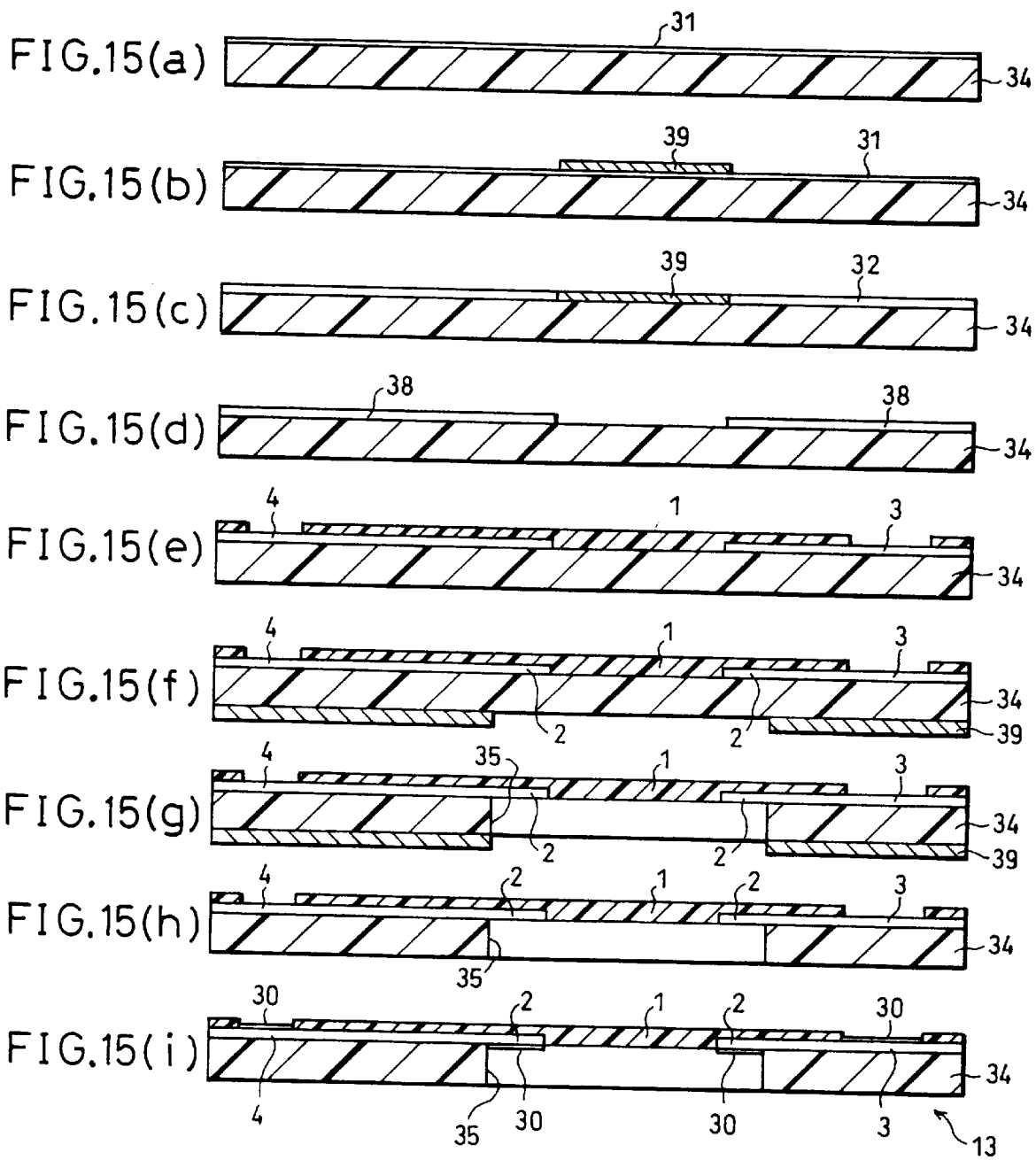

SEMICONDUCTOR DEVICE AND FILM CARRIER TAPE AND RESPECTIVE MANUFACTURING METHODS THEREOF

FIELD OF THE INVENTION

The present invention relates to a semiconductor device adopting a film carrier tape and a manufacturing method thereof, and also to a film carrier tape and a manufacturing method thereof.

BACKGROUND OF THE INVENTION

In recent years, there has been demand for thinner and smaller electric devices such as liquid crystal display devices.

A semiconductor device adopting a film carrier tape (hereinafter referred to as a film carrier-type semiconductor device) is beginning to be used mainly for a liquid crystal driver. A package of the film carrier-type semiconductor device is generally referred to as TCP (Tape Carrier Package).

FIG. 16 and FIG. 17 illustrate a conventional film carrier-type semiconductor device (TCP) wherein a semiconductor chip 110 is mounted on a device hall 135 which is provided on a predetermined position on an insulating base material tape 134. Note that, in the following explanation, the film carrier-type semiconductor device will be referred to simply as a semiconductor device.

The semiconductor device has an arrangement wherein the semiconductor chip 110 is electrically connected to inner leads 102 via bumps 111 from the side opposite to the insulating base material tape 134 surface on which conductive wiring is provided. The inner leads 102 are provided so as to project into the device hall 135. The conductive wiring is composed of (1) outer leads 103 and 104 and (2) the inner leads 102 provided on the insulating base material tape 134. The bumps 111 are made of gold (Au).

On a wiring pattern composed of the inner leads 102 and the outer leads 103 and 104, there is provided an organic insulating film 101 having a predetermined pattern. Also, resin 122 is provided by potting around portions where the semiconductor chip 110 and the inner leads 102 are combined with each other.

The semiconductor device having the described arrangement is said to have a normal bonding structure wherein the semiconductor chip 110 is connected to the inner leads 102 from the side opposite to the insulating base material tape 134 surface on which the conductive wiring is provided.

The following will explain a manufacturing method of the semiconductor device having the described arrangement.

First, a wafer is attached to a dicing sheet so as to be diced into individual semiconductor chips. Here, the thickness of the wafer is 0.625 mm if the diameter of the wafer is 6 inch, or 0.725 mm if the diameter of the wafer is 8 inch.

Secondly, in an inner lead bonding (ILB) step, the semiconductor chip is combined with a film carrier.

Generally, an ILB device employed in the ILB step includes a mechanism for transporting the film carrier, a mechanism for aligning (1) the electrode of the semiconductor chip and (2) the inner leads so as to induce bonding, and a mechanism for storing the film carrier which has been subjected to the bonding.

Specifically, in the ILB step, upon setting the film carrier to the ILB device, the film carrier is transported piece by piece so as to connect the semiconductor chip to the inner leads. Note that, the semiconductor chip is aligned by two alignment-use inner leads of the film carrier before the connection takes place.

The semiconductor chip is set to the ILB device while attached to a dicing sheet. Each semiconductor chip thus set is lifted from below by a metal needle and is absorbed by an absorbing collet so as to be fixed on a bonding stage of the ILB device.

Thirdly, the semiconductor chip thus fixed on the bonding stage is aligned in accordance with the aluminium pattern formed on the semiconductor chip. Namely, in the ILB device, the bonding stage fixed on the semiconductor chip, rather than the film carrier, is moved so as to precisely align the inner leads of the film carrier and the electrode of the semiconductor chip.

Fourthly, after the semiconductor chip is aligned, a bonding tool applies pressure and heat to the semiconductor chip through the inner leads of the film carrier. This results in the formation of an eutectic composed of (1) a bump made of gold (Au) provided on the semiconductor chip and (2) tin (Sn) of the inner leads of the film carrier, thereby combining the semiconductor chip with the film carrier. Note that, the heat applied by the bonding tool has a temperature of substantially 500° C. which is applied for substantially 1 second. Also, a cycle of inner-lead-bonding of one semiconductor chip is substantially 4 to 10 seconds.

After completion of the ILB, liquid resin (protective resin) is applied to the surface of and around the semiconductor chip. The liquid resin thus applied to the surface of the semiconductor passes through the space between the semiconductor chip and the device hall of the film carrier and reaches the sides of the semiconductor chip so as to form meniscus (resin 122 having a semilunar shape on the sides of the semiconductor chip 110 in FIG. 16) on a polyimide insulating base material tape of the film carrier and the semiconductor chip. Note that, the liquid resin is made of thermosetting resin which is completely cured in an oven for substantially 2 to 10 hours after it is prebaked in a curing furnace.

After sealing the protective resin, the semiconductor device is marked. The marking is made by a laser or with ink on the surface of the organic insulating film provided on a resin surface, the bottom surface of the semiconductor chip, a film carrier base material, and the film carrier.

The semiconductor device manufactured in the described manner is sorted out in the testing step so as to distinguish defective products from nondefective products.

Next, the following will explain a structure and a manufacturing method of the film carrier employed in the semiconductor device.

As shown in FIG. 17 and FIG. 18(i), the film carrier has an arrangement wherein the inner leads 102 and the outer leads 103 and 104 (conductive wiring) are provided so as to be patterned on the insulating base material tape 134 provided with the device hall 135 on its predetermined position, and the portion of each lead which is not covered with the organic insulating film 101 is covered with tin-plate 130.

The following will explain the manufacturing method of the film carrier having the described arrangement.

First, a slit is provided on a tape base material made of polyimide in accordance with the semiconductor chip to be combined with. Here, the tape base material has a width of substantially 500 mm, and the slit has a width of either 35 mm, 48 mm, or 70 mm. Then, the surface of the tape base material thus prepared is laminated with a bonding agent, thereby forming the insulating base material tape 134 of FIG. 18(a).

Secondly, as shown in FIG. 18(b), the insulating base material tape 134 is perforated by molding. The perforation is required for the device hall 135, the slit (not shown), and the film transport.

Thirdly, as shown in FIG. 18(c), an electrolytic copper foil 138 is laminate-bonded with the insulating base material tape 134 by the bonding agent laminated on the surface of the insulating base material tape 134. Here, the electrolytic copper foil 138 is available in various thicknesses, i.e.,18 $\mu$m, 24 $\mu$m, and 36 $\mu$m, etc. from which an appropriate thickness is selected according to the pitch of the inner leads 102.

Fourthly, as shown in FIG. 18(d), a photoresist 139 is applied to the surface of the electrolytic copper foil 138 provided on the insulating base material tape 134, and an etching resist 109 is printed with respect to the device hall 135 from the side opposite to the surface of the insulating base material tape 134 on which the electrolytic copper foil 138 is provided so as to form a unidirectional wiring pattern on the surface of the insulating base material tape 134.

Then, the surface of the electrolytic copper foil 138 of FIG. 18(d) provided on the insulating base material tape 134 is processed so as to remove an oxidation film or other films. Thereafter, after applying the photoresist 139 so as to form a predetermined pattern, as shown in FIG. 18(e), the photoresist 139 is exposed and developed, thereby forming an etching mask 139a.

Fifth, as shown in FIG. 18(f), the electrolytic copper foil 138 is etched with stannic chloride so as to form a wiring pattern 138a. Then, an alkaline solution is applied so as to simultaneously remove (1) the photoresist 139 provided on the wiring pattern 138a made of the electrolytic copper foil 138 and (2) the etching resist 109 so as to expose the wiring pattern 138a, as shown in FIG. 18(g).

Sixth, as shown in FIG. 18(h), the organic insulating film 101 is printed on the wiring pattern made of the electrolytic copper foil 138 except portions of the outer lead 103 of the input side, the outer lead 104 of the output side, and the inner leads 102. Here, the organic insulating film 101 acts as a solder resist.

Finally, as shown in FIG. 18(i), after printing the organic insulating film 101, the respective exposed portions of the outer leads 103 and 104 and the inner leads 102 of the wiring pattern 138a, are non-electroplated with tin so as to form the tin-plate 130 having a thickness in a range of 0.2 $\mu$m to 0.6 $\mu$m. Then, after the tin metal plating, the film carrier having the described arrangement is cured for 1 hour to 3 hours at a temperature in a range of 110° C., to 140° C. as a preventative measure against generation of whisker.

The film carrier manufactured in the described manner is shipped after performing an open/short test.

Alternatively, other than the described semiconductor device having the normal bonding structure, the semiconductor devices shown in FIG. 19 and FIG. 20 are available as a semiconductor device adopting the film carrier. The semiconductor devices of FIG. 19 and FIG. 20 have an arrangement wherein the semiconductor chip 110 is provided on the side where the wiring pattern of the insulating base material tape 134 is formed. A semiconductor device having this arrangement is said to have a reverse bonding structure. In FIG. 19 and FIG. 20, members having the same functions as the members shown in FIG. 16 are given the same reference numerals, and detailed explanations thereof are omitted here.

In the semiconductor device of FIG. 20, after completion of the ILB, low-viscous resin (under fill resin) 124 is injected into a portion where the semiconductor chip 110 and the insulating base material tape 134 are combined with each other so as to be cured, thereby sealing the protective resin.

Resin stoppers 137 are provided on the organic insulating film 101 (1) provided between the outer lead 103 and the inner leads 102 provided on the insulating base material tape 134 and (2) provided between the outer lead 104 and the inner leads 102 provided on the insulating base material tape 134. The resin stoppers 137 are provided so as to prevent the low-viscous resin 124 from flowing out.

According to the afore-mentioned conventional semiconductor device provided with the device hall and the overhanging inner leads (see FIG. 16, FIG. 17, and FIG. 19), the inner leads 102 overhang the device hall 135, and the resin 122 is provided around the device hall 135 so as to maintain a mechanical strength. However, this arrangement has a drawback in that the thickness of the resin 122 is in a range of only 100 $\mu$m to 300 $\mu$m even on the semiconductor device 110. This reduces the mechanical strength, and therefore presents a problem that the semiconductor device 110 may be broken only with a small external force.

The conventional semiconductor devices having the described arrangements have several drawbacks.

(1) In the above-mentioned semiconductor device, the inner leads 102 project into the device hall 135 of the insulating base material tape 134 (film carrier). Thus, in the case where the inner leads 102 have a fine pitch so as to make the gap between inner leads 102 have a length of not more than 50 $\mu$m, the thickness of the inner leads 102 becomes thin and the width of the inner leads narrows as well. This reduces the strength of the inner leads 102, and therefore presents a problem that the inner leads 102 are susceptible to deformation.

(2) In the above-mentioned semiconductor device, in the ILB, since the bonding tool which has been heated is pressed against the inner leads which have been plated with tin, the bonding tool is stained as the tin adheres to the bonding tool. In this case, the bonding tool is cleaned by polishing thereof with a ceramic abrasive plate. However, because the bonding tool is required to be cleaned at least once while manufacturing 100 semiconductor devices, the throughput of the ILB step cannot be improved. Further, repeated cleaning of the bonding tool scratches the surface of the bonding, which causes inadequate results to occur in the ILB step.

(3) Normally, the ILB completes with the formation of the eutectic composed of the bump on the semiconductor chip and the tin plated on the inner leads. Therefore, when the thickness of the tin plated on the inner leads side is thick and the temperature in the ILB step rises above a required temperature, the size of the eutectic composed of the gold and the tin increases greatly, which substantially lowers the strength of the inner leads after the ILB.

(4) In the ILB step, a CCD (Charge Coupled Device) camera recognizes a portion where the semiconductor chip and the film carrier are combined with each other. However, because the bonding tool is heated to substantially 500° C., a flame is generated when the CCD camera recognizes the portion where the semiconductor chip and the film carrier are combined with each other. This lowers the recognition accuracy. Further, thermal expansion causes the insulating base material tape to bend, thereby lowering the accuracy of aligning the semiconductor chip and the film carrier.

(5) The semiconductor chip after the ILB is fixed by the inner leads of the film carrier. However, because the inner leads are made of copper foil having a thickness of 18 μm to 36 μm, the strength thereof is extremely low. Thus, if handled improperly, such a problem as deformation or breakage of the inner leads may occur.

(6) After the ILB, the resin-sealing is made by potting of liquid resin made of the thermosetting resin with respect to the portion where the semiconductor chip and the film carrier are combined with each other. However, in general, the viscosity of the liquid resin tends to vary depending on the manufacturing lot. This presents a problem that the thicknesses of the resin on the semiconductor chip vary. For example, when the thickness of the resin film on the semiconductor chip is thin, the moisture resistance lowers in this thin portion. Further, if a foreign conductive object adheres to this thin portion on the semiconductor chip, failure such as an electrical leaking might result.

(7) For post curing, it is required to cure the liquid resin (sealant) in an oven for additional 2 hours to 10 hours after it is prebaked. For this reason, it takes time to produce a semiconductor device whose semiconductor chip and film carrier are combined with each other, and in which the combined portion is sealed by the liquid resin (hereinafter referred to as an assembly).

Also, the post curing of the resin causes copper (material for a conductive wiring pattern) to diffuse into the tin plated on the outer lead. This makes it difficult to solder the assembly to an electric device such as a liquid crystal module.

(8) According to the conventional semiconductor device, it is required for the inner leads to have a bend having a length of substantially 100 μm (see FIG. 16) so as to prevent the breakage of the inner leads due to the expansion of the film carrier. For this reason, a large portion of the semiconductor device protrudes from the device hall of the film carrier, thereby increasing the thickness of the semiconductor device.

(9) In a film carrier-type semiconductor device having a long narrow semiconductor chip, the semiconductor chip may crack due to a small external force.

(10) In the conventional film carrier-type semiconductor device, when mounting, the interface between the polyimide base material of the film carrier and the resin (sealant) is susceptible to a crack or a peeling. This lowers the moisture resistance of a product employing the above-mentioned semiconductor device.

(11) In the conventional film carrier-type semiconductor device, the bumps on the semiconductor device can only be provided peripherally in accordance with design the inner leads of the film carrier. This lowers flexibility of the semiconductor device.

(12) A conventional semiconductor device provided with no device hall (see FIG. 20) has an arrangement wherein the semiconductor chip is connected face down to the inner leads from above the conductive wiring pattern formed on the insulating base material tape. For this reason, compared to the semiconductor device of FIG. 16 and FIG. 19 provided with the device hall, higher strength can be achieved. However, when mounting the semiconductor device of a reverse bonding type on the liquid crystal module of FIG. 3 (explanatory drawing of the present invention), the semiconductor chip contacts a glass epoxy substrate or a liquid crystal panel connected to the conductive wiring pattern. Thus, when mounting the semiconductor device of a reverse bonding type on the liquid crystal module, it is required to provide a space in the liquid crystal module so as to prevent the semiconductor chip from contacting the glass epoxy substrate or the liquid crystal panel. However, in this case, the semiconductor device cannot be made thinner. The same problem is also presented in the semiconductor device of a reverse bonding type shown in FIG. 19.

SUMMARY OF THE INVENTION

The present invention offers a solution to the above mentioned problems, and accordingly it is an object of the present invention to provide a semiconductor device (semiconductor device having a structure of normal bonding type) and a film carrier tape and respective manufacturing methods thereof wherein inner leads of a film carrier are supported by adhesion of an organic insulating film so as to firmly combine the film carrier and a semiconductor chip with each other.

In order to achieve the above-mentioned object, a semiconductor device of the present invention provides a semiconductor chip mounted on a film carrier. The film carrier is preferably composed of an insulating base material tape having an opening section and a conductive wiring having an inner leads section electrically connected to the semiconductor chip in the opening section. The conductive wiring is provided on a main surface of the insulating base material tape, and the film carrier is provided with an organic insulating film which is different from the conductive wiring. The organic insulating film covers the conductive wiring and the inner leads section so as to support the inner leads section.

With this arrangement, since the inner leads section is supported by the organic insulating film, the strength of the inner leads section can be improved. This increases the strength of the connection between the semiconductor chip and the inner leads. Thus, it is possible to lower the incidence of breakage of the inner leads section due to handling etc. and cracking of the semiconductor chip, thereby improving the yield of the semiconductor device.

In a conventional semiconductor device having a normal bonding structure, a bend is provided on the inner leads section so as to prevent the breakage of the inner leads section. This increases the thickness of the semiconductor device.

In contrast, in the afore-mentioned semiconductor device having the described arrangement, since the inner leads section is supported by the organic insulating film, it is not required to provide bends on the inner leads section, thereby reducing the thickness of the semiconductor device.

In general, when fine-pitching the inner leads section, the thickness of copper foil becomes thin, and the width of the inner leads section reduces as well, which greatly lowers the strength of the inner leads section. Thus, the conventional semiconductor device having a normal bonding structure has a limit in fine-pitching the inner leads section.

In contrast, in the described arrangement, when the inner leads section is supported by the organic insulating film, the strength of the inner leads section remains almost unaffected even when fine-pitching the inner leads section. This allows to further fine-pitch the inner leads section, thereby permitting further reduction in the size of the semiconductor device. The film carrier tape of the present invention is preferably composed of an insulating base material tape having an opening section and conductive wiring having an inner leads section electrically connected to the semiconductor chip in the opening section. The conductive wiring is provided on a main surface of the insulating base material tape, and the film carrier tape is provided with an organic insulating film which is different from the conductive wiring. The organic insulating film covers the conductive wiring and the inner leads section so as to support the inner leads section.

With this arrangement, since the inner leads section is supported by the organic insulating film, the strength of the inner leads section can be improved, which increases the strength of the connection between the semiconductor chip and the inner leads. Thus, it is possible to lower the incidence of breakage of the inner leads section due to handling etc. and cracking of the semiconductor chip, thereby improving the yield of the semiconductor device.

In general, when further fine-pitching the inner leads section, the thickness of copper foil becomes thin, and the width of the inner leads section reduces as well, which greatly lowers the strength of the inner leads section. Thus, the conventional film carrier tape having a device hall for use in a conventional semiconductor device having a normal bonding structure has a limit in fine-pitching the inner leads section.

In contrast, as in the described arrangement, when the inner leads section is supported by the organic insulating film, the strength of the inner leads section remains almost unaffected even when further fine-pitching the inner leads section. This allows to further fine-pitch the inner leads section, thereby permitting further reduction in the size of the semiconductor device.

For a fuller understanding of the nature and advantages of the invention, reference should be made to the ensuing detailed description taken in conjunction with the accompanying drawings.

BRIEF DESCRIPTION OF THE DRAWINGS

FIG. 13(a) is an explanatory drawing showing a step of provisionally bonding a semiconductor chip with inner leads.

FIG. 13(b) is a drawing of a manufacturing device of the semiconductor device of the present invention explaining a step of permanently solderless-connecting the semiconductor chip with the inner leads.

FIG. 14(a) through FIG. 14(k) are explanatory drawings showing a manufacturing procedure of the film carrier employed in the semiconductor device of the present invention.

FIG. 15(a) through FIG. 15(i) are explanatory drawings showing another manufacturing procedure of the film carrier employed in the semiconductor device of the present invention.

DESCRIPTION OF THE EMBODIMENTS

The following will explain one embodiment of the present invention.

Figure 1:
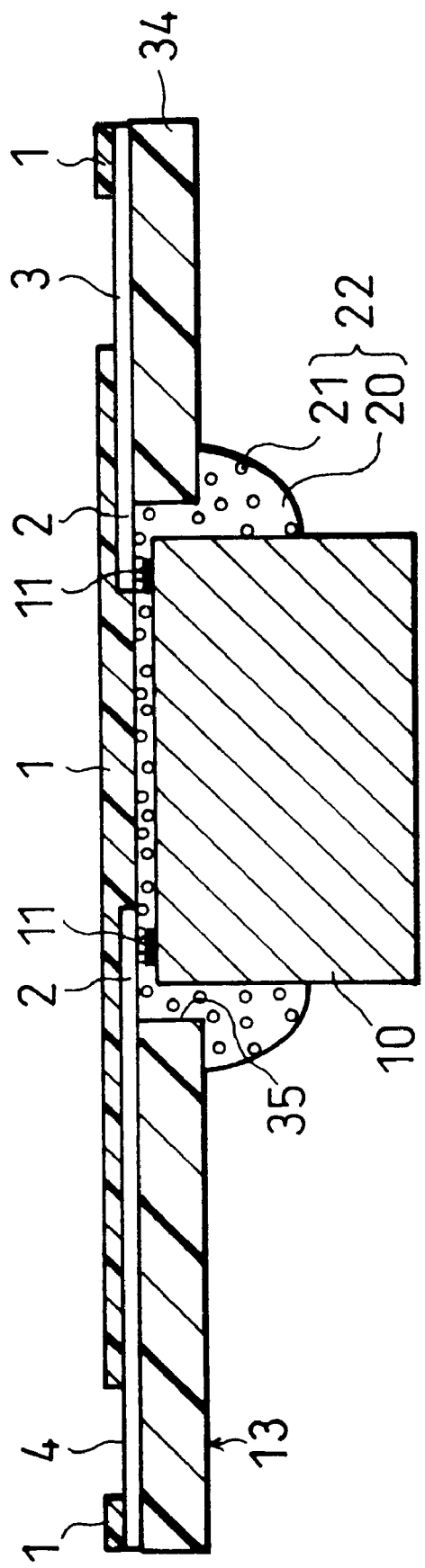
FIG. 1 is a schematic cross sectional view of a semiconductor device in accordance with one embodiment of the present invention.

As shown in FIG. 1, a semiconductor device in accordance with the present embodiment has a normal bonding structure wherein a semiconductor chip 10 is mounted on a film carrier 13 from the opposite side of the film carrier 13 surface on which the conductive wiring is provided.

The film carrier 13 is made of an insulating base material tape 34. The insulating base material tape 34 is provided with a device hall 35 in which the semiconductor chip 10 is combined. The surface of the film carrier 13 is provided with an input-side outer lead 3 and an output-side outer lead 4 and inner leads 2 (these leads become conductive wiring). The inner leads 2 are provided so as to project into the device hall 35 respectively from the input-side outer lead 3 and the output-side outer lead 4.

The insulating base material tape 34 is coated with an organic insulating film 1 except the input-side outer lead 3 and the output-side outer lead 4 portions of the conductive wiring. The organic insulating film 1 is, for example, made of a solder resist material, and joints and supports the inner leads 2. Note that, a material for the organic insulating film 1 is not limited to the solder resist, but any material may be adopted, provided that it has a required strength of supporting the inner leads and endures a heat temperature of about 200° C. in the following steps.

On the side of the semiconductor chip 10 where electrodes having an aluminium pattern are formed, bumps 11 made of gold (Au) are provided. The bumps 11 and the inner leads 2 of the film carrier 13 are electrically connected to each other via anisotropic conductive resin 22 (sealing resin). Namely, the semiconductor chip 10 and the inner leads 2 are electrically connected to each other.

The anisotropic conductive resin 22 is composed of insulating sealing resin 20 and conductive particles 21. The insulating sealing resin 20 is made of thermosetting resin such as epoxy resin, and the conductive particles 21 are plastic balls coated with a metal such as nickel (Ni) or gold (Au). The anisotropic conductive resin 22 is provided so as to fill the portion where the semiconductor chip 10 and the film carrier 13 are combined with each other. Further, the anisotropic conductive resin 22 has functions of (1) adhering to the semiconductor chip 10 and the film carrier 13 for support and (2) sealing the surface of the semiconductor chip 10.

Figure 2:
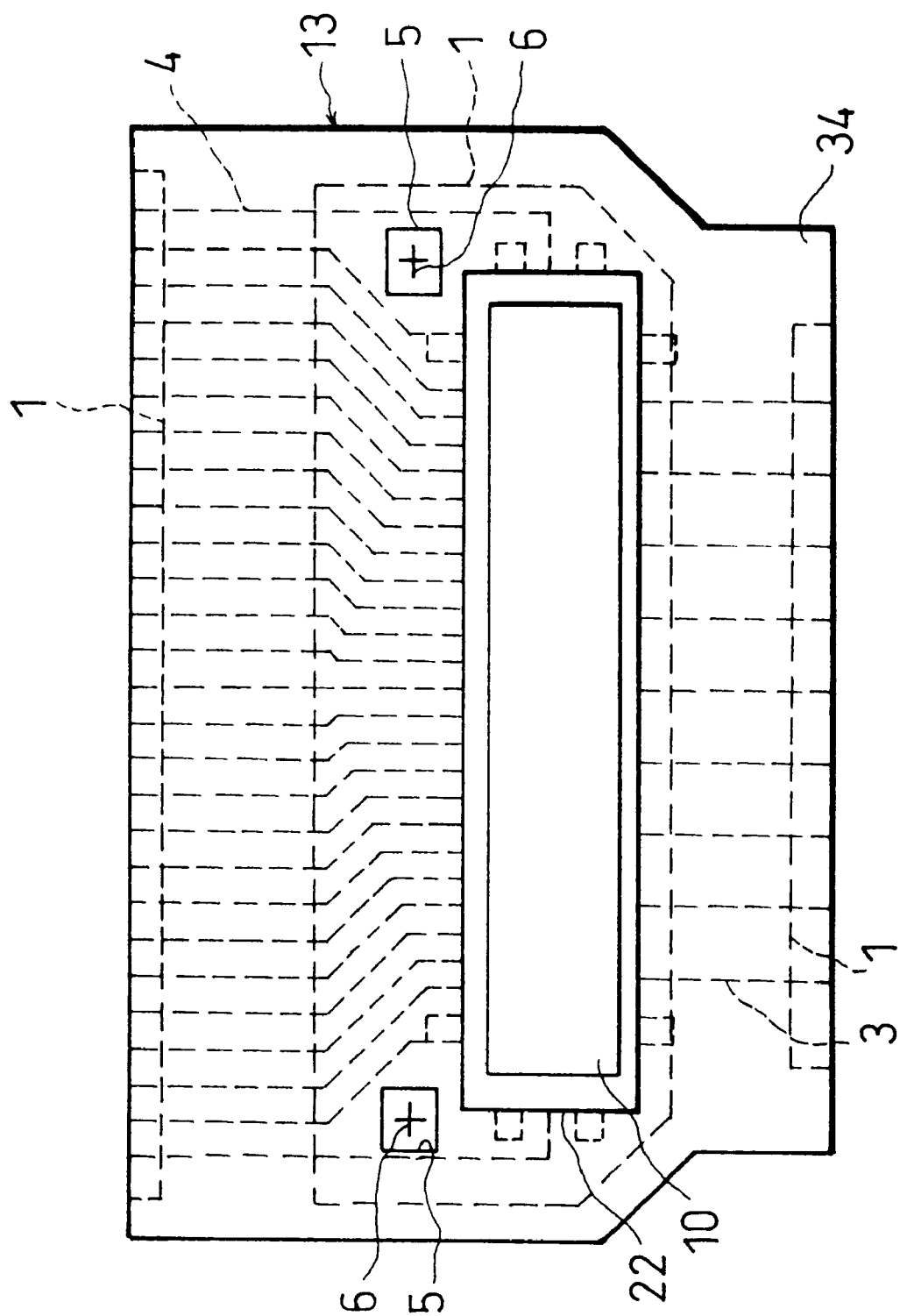
FIG. 2 is a bottom plan view of the semiconductor device of FIG. 1.

As shown in FIG. 2, the film carrier 13 is provided with two alignment sections 5 in vicinities of a portion where the semiconductor chip 10 is combined. Each alignment section 5 is provided with an alignment mark 6 which is used to precisely align the inner leads 2 of the film carrier 13 and the semiconductor chip 10. A detailed explanation of the alignment marks 6 will be provided later.

Figure 3:
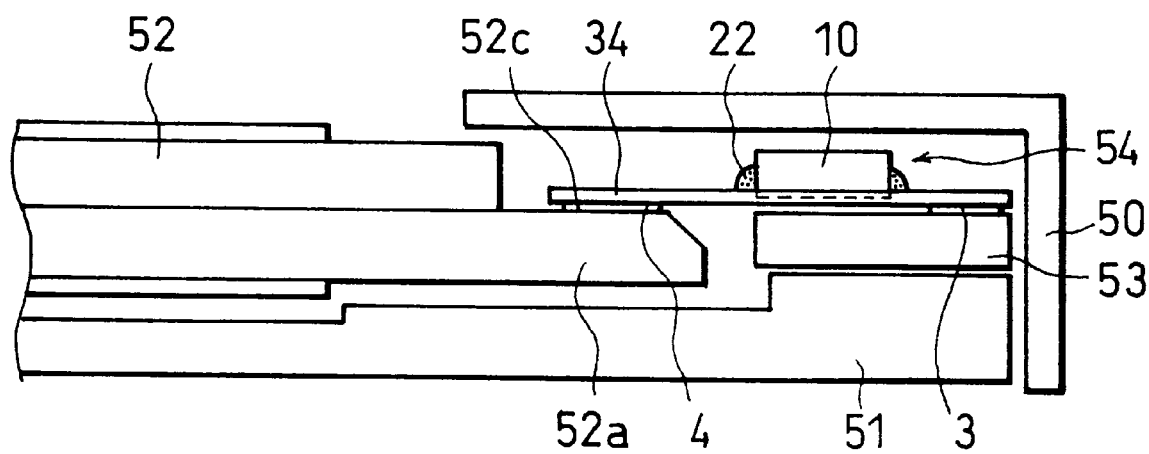
FIG. 3 is a schematic cross sectional view of a liquid crystal module adopting the semiconductor device of FIG. 1.

The semiconductor device having the described arrangement may be employed in a liquid crystal module shown in FIG. 3. In this liquid crystal module, a basel 50 covers peripheral parts, other than the display region of a fluorescent tube 51 (backlight) and a liquid crystal panel 52 (display panel). In the parts covered with the basel 50, an electrode 52c and a glass epoxy substrate 53 are electrically connected to each other via the semiconductor device 54 having the described arrangement. The electrode 52c is provided on the surface of peripheral edge portion 52a of the liquid crystal panel 52, and the glass epoxy substrate 53 is made of glass epoxy resin constituting a liquid crystal driver etc.

Since the semiconductor device 54 has a normal bonding structure, as shown in FIG. 3, the conductive wiring (input-side outer lead 3 and output-side outer lead 4) is provided on the side of the liquid crystal panel 52 and the glass epoxy substrate 53. Therefore, the semiconductor chip 10 does not protrude towards the side of the liquid crystal panel 52 and the glass epoxy substrate 53.

Generally, in a liquid crystal module, it is preferable to reduce as small as possible the surface (casing surface) of the basel 50 on the liquid crystal panel 52 side. It is further preferable to reduce the thickness of the liquid crystal module as thin as possible.

Therefore, when the semiconductor device of the present embodiment is employed in a liquid crystal module shown in FIG. 3, contrary to the semiconductor device having a reverse bonding structure, it is not required to provide a space for preventing the semiconductor chip from contacting a panel or a substrate. This allows to reduce the size of the liquid crystal module to be reduced, especially the casing surface, thereby permitting an increase in the proportion of the display region in the liquid crystal module.

As shown in FIG. 1, in the semiconductor device having the described arrangement, the bumps 11 of the semiconductor chip 10 are electrically connected to the inner leads 2 via the anisotropic conductive resin 22. However, as long as the inner leads 2 are adhered to and supported by the organic insulating film 1, the connection between the semiconductor chip 10 and the inner leads 2 is not limited to the specified arrangement, but the following arrangements may be adopted as well.

Figure 4:
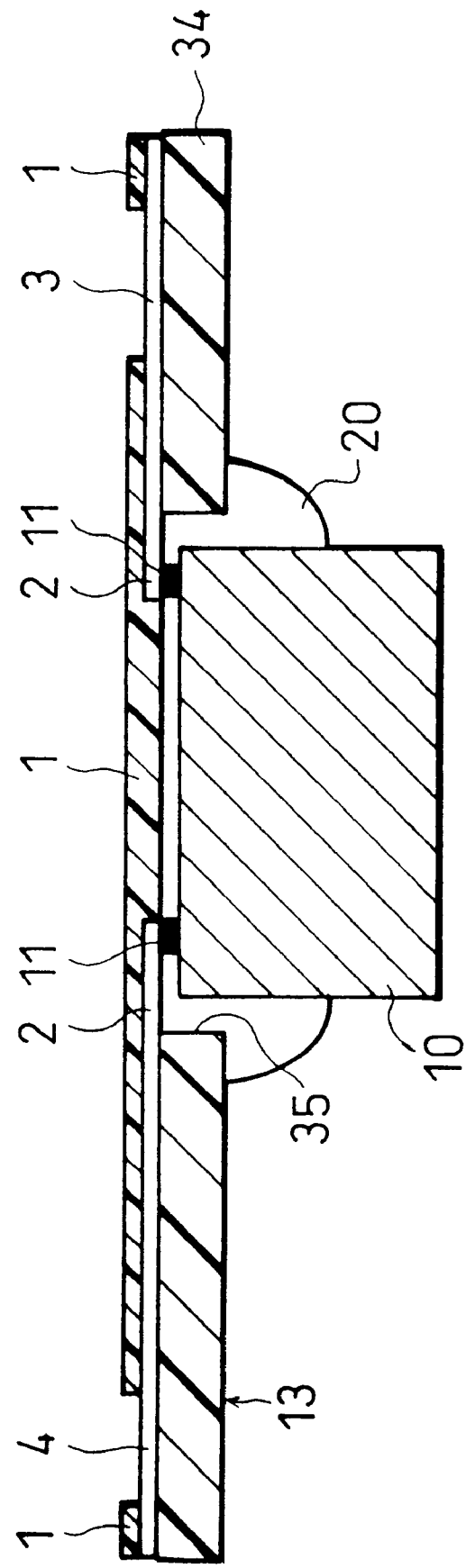
FIG. 4 is a schematic cross sectional view of a semiconductor device in accordance with the second embodiment of the present invention.

As shown in FIG. 4, the semiconductor device of the present embodiment may have an arrangement wherein the bumps 11 of the semiconductor chip 10 and the inner leads 2 form eutectic so as to be connected to each other. In this case, the bumps 11 of the semiconductor chip 10 and the inner leads 2 form eutectic so as to be connected to each other on a portion where the semiconductor chip 10 and the film carrier 13 are combined with each other. Therefore, it is not required to use the anisotropic conductive resin 22, but the insulating sealing resin 20 including no conductive particles 21 (for example, epoxy resin etc.) may be used instead.

Alternatively, the semiconductor device of the present embodiment may have an arrangement wherein the semiconductor chip 10 is electrically connected to the inner leads, not via the bumps 11 (see FIG. 1). In this case, the anisotropic conductive resin 22 is provided between the semiconductor chip 10 and the inner leads 2, and the semiconductor chip 10, a wiring electrode pad (not shown) and the inner leads 2 are connected to each other via the conductive particles 21 of the anisotropic conductive resin 22.

With this arrangement, compared to the case where the bumps 11 are provided on the semiconductor chip 10, more pressure must be applied on the semiconductor chip 10 during manufacture.

Figure 6:
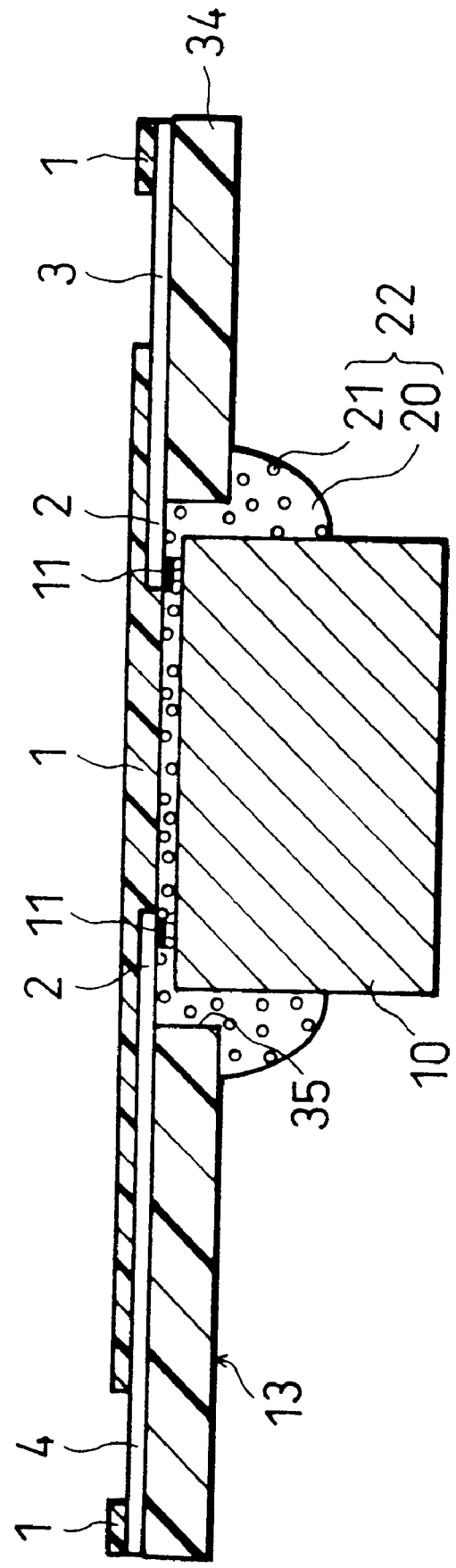
FIG. 6 is a schematic cross sectional view of a semiconductor device in accordance with the fourth embodiment of the present invention.

Further, as shown in FIG. 6, the semiconductor device of the present embodiment may have an arrangement wherein the bumps 11 are provided on the side of the inner leads 2. This arrangement is preferable because, when the inner leads 2 are fixed to the organic insulating film 1 as in the present embodiment, it is possible to provide the bumps 11 on the inner leads 2. In contrast, in the conventional arrangement, it is difficult to provide the bumps 11 on the inner leads 2 because the inner leads are not fixed above the device hall.

Figure 7:
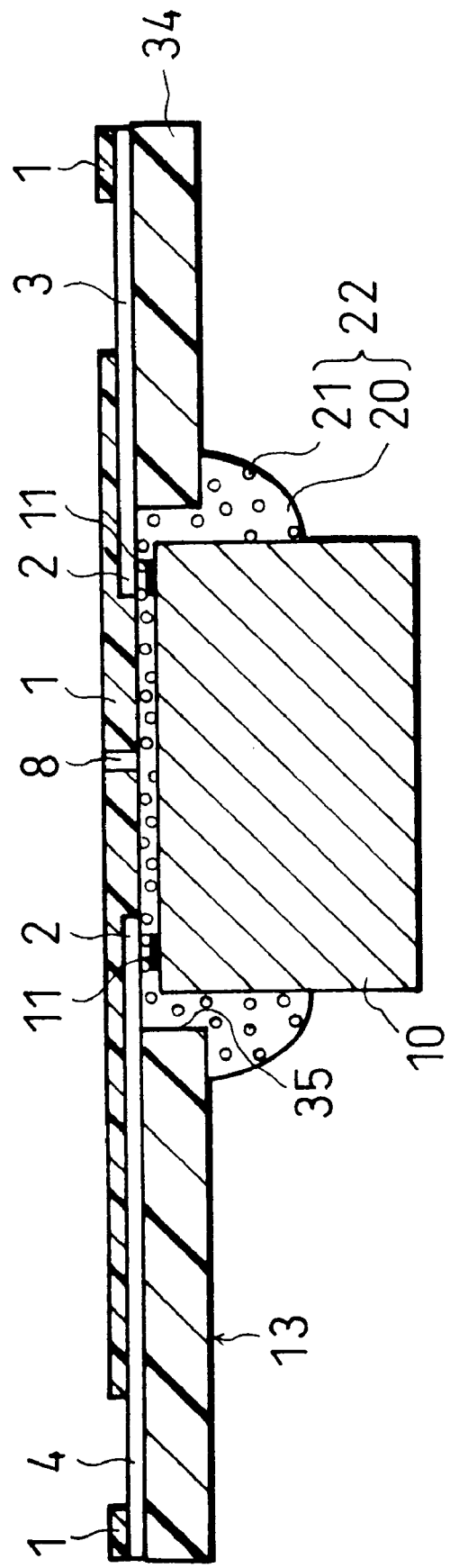
FIG. 7 is a schematic cross sectional view of a semiconductor device in accordance with the fifth embodiment of the present invention.

Furthermore, as shown in FIG. 7, the semiconductor device of the present embodiment may have an arrangement wherein at least one opening section 8 is provided through a portion of the organic insulating film 1, which covers the inner leads 2, the portion facing the semiconductor chip 10. In this manner, by providing the opening section 8 through the organic insulating film 1, it is possible to release air bubbles which are generated between the semiconductor chip 10 and the organic insulating film 1 when connecting the semiconductor chip 10 via the anisotropic conductive resin 22.

With this arrangement, it is possible to improve the adhesion between the semiconductor chip 10 and the organic insulating film 1. Namely the adhesion between the semiconductor chip 10 and the inner leads 2 can be improved, thereby improving the reliability of the semiconductor device.

Each of the described semiconductor devices of FIG. 1 and FIG. 4 through FIG. 7 has an arrangement wherein the anisotropic conductive resin 22 or the insulating sealing resin 20 including no conductive particles 21 fill the space between the semiconductor chip 10 and the film carrier 13 so as to seal the surface of the semiconductor chip 10, thereby reinforcing the support of the semiconductor chip 10 by the film carrier 13 to some degree.

Figure 8:
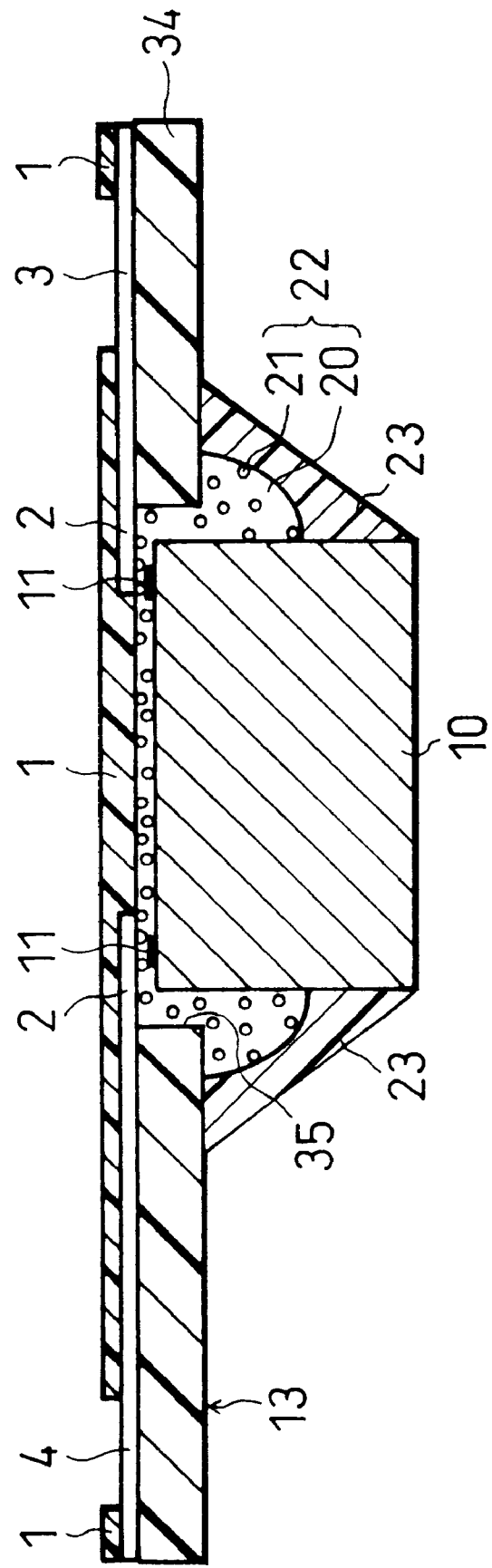
FIG. 8 is a schematic cross sectional view of a semiconductor device in accordance with the sixth embodiment of the present invention.

In order to ensure a mechanical strength of the semiconductor device and reliability equal to or higher than that of a mold type, a semiconductor device having the following arrangements can be adopted. FIG. 8 shows an arrangement wherein thermosetting liquid resin is solidified by potting so as to form protective resin 23 around the semiconductor chip 10. Alternatively, FIG. 9 shows an arrangement wherein the entire semiconductor chip 10 is covered with the protective resin 23.

Figure 9:
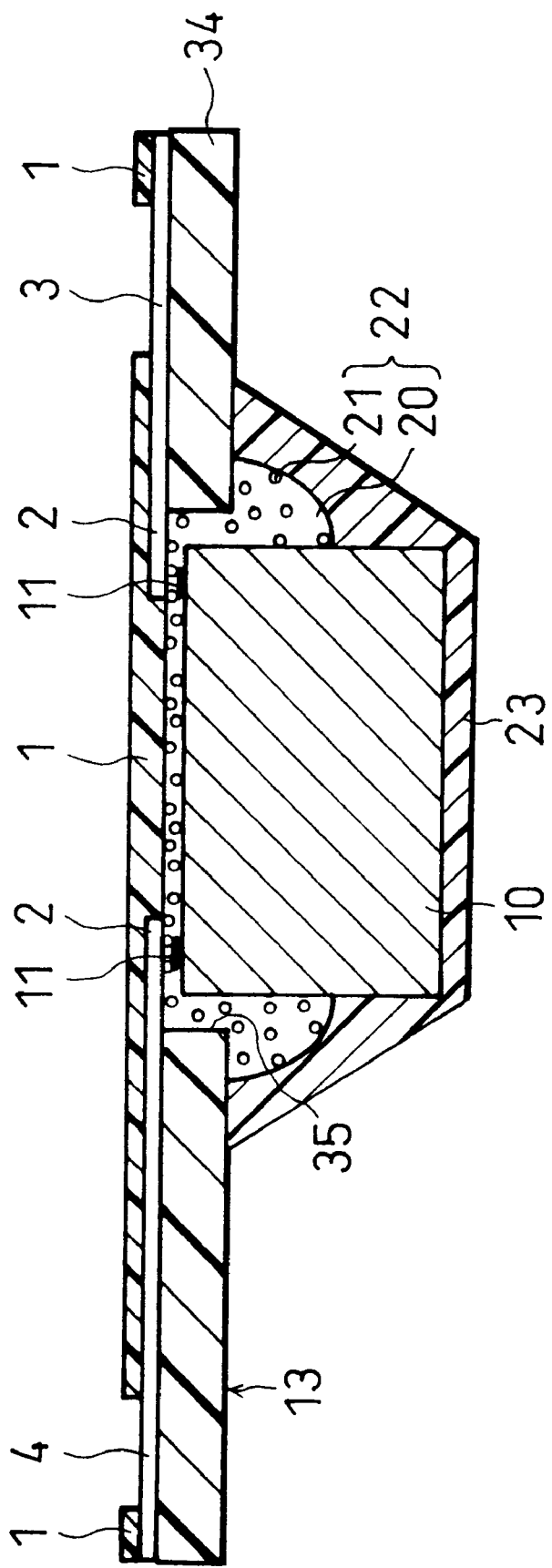
FIG. 9 is a schematic cross sectional view of a semiconductor device in accordance with the seventh embodiment of the present invention.
Figure 10:
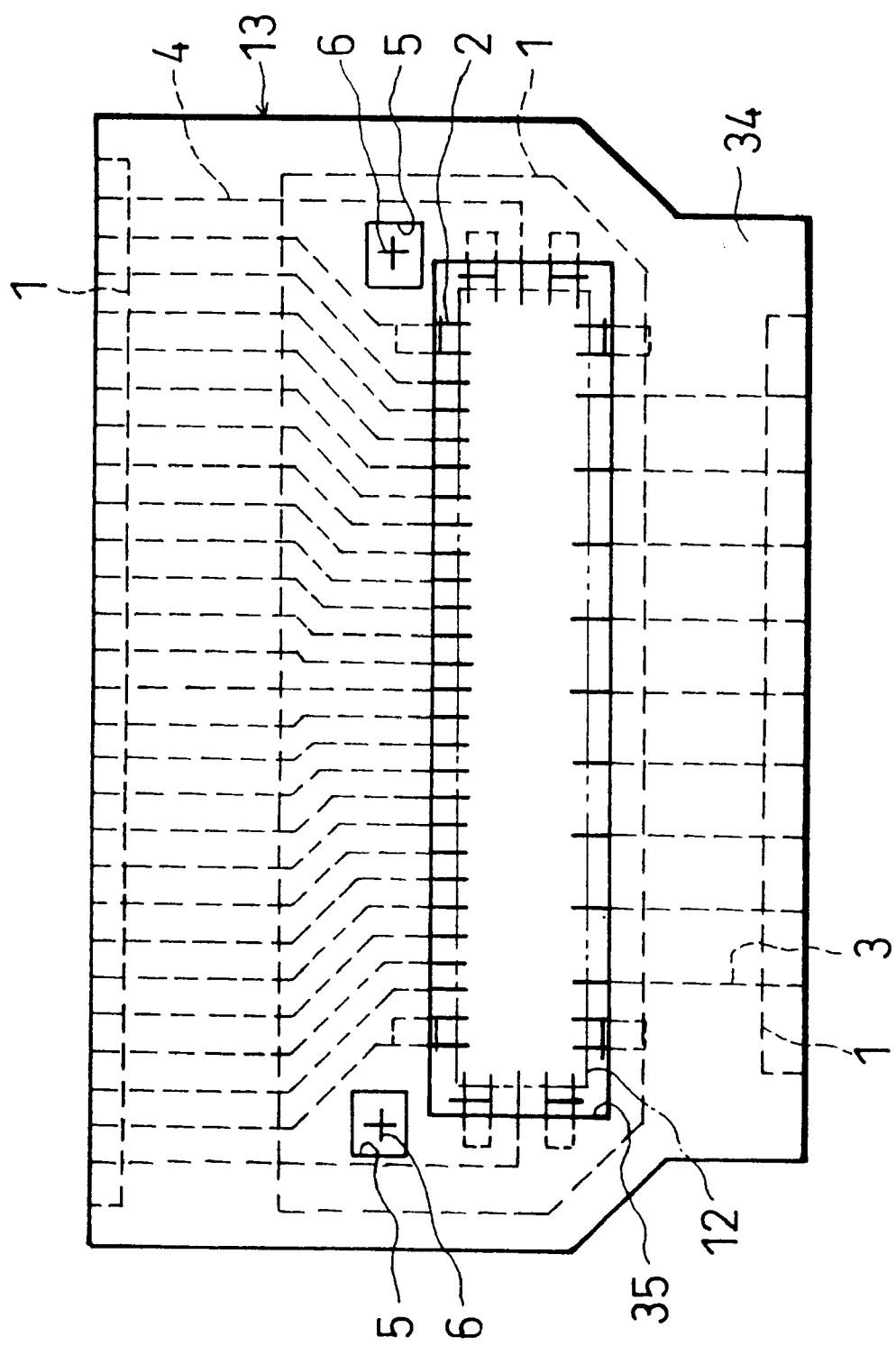
FIG. 10 is a bottom plan view of a film carrier employed in the semiconductor device of the present invention.

In particular, the arrangement adopted by the semiconductor device of FIG. 9 is suitable with a thin semiconductor chip 10, because the arrangement thereof has mechanical strength higher than that adopted by the semiconductor device of FIG. 8. Note that, for example, the semiconductor device of FIG. 9 can have a chip thickness of 400 µm.

The semiconductor devices of FIG. 8 and FIG. 9 have an arrangement wherein the semiconductor chip 10 of FIG. 1 is covered with the protective resin 23. However, the arrangement is not limited to the specified one, and alternatively it is possible to adopt an arrangement wherein the semiconductor chip 10 of FIG. 4 through FIG. 7 is covered with the protective resin 23.

As described, the film carrier 13 adopted in the semiconductor device is provided with the alignment marks 6 on the alignment sections 5 which are provided around the semiconductor chip 10. The alignment marks 6 are used to precisely align the semiconductor chip 10 and the film carrier 13 (ILB position 12).

The alignment marks 6 or other alignment marks are provided in the form of a cross on a region where the organic insulating film 1 of the insulating base material tape 34 is not provided, i.e., a region where the organic insulating film 1 is not printed, when forming the conductive wiring pattern composed of the inner leads 2, the input-side outer lead 3, and the output-side outer lead 4. Note that, the alignment marks 6 are provided on a portion which is not covered with the anisotropic conductive resin 22. Also, at least two alignment marks are required for aligning the semiconductor chip 10 and the film carrier 13.

Because the insulating base material tape 34 is transparent, the portion where no organic insulating film 1 is printed can be seen through the insulating base material tape 34. This arrangement allows the alignment marks 6 to be provided in a see-through manner.

Figure 11:
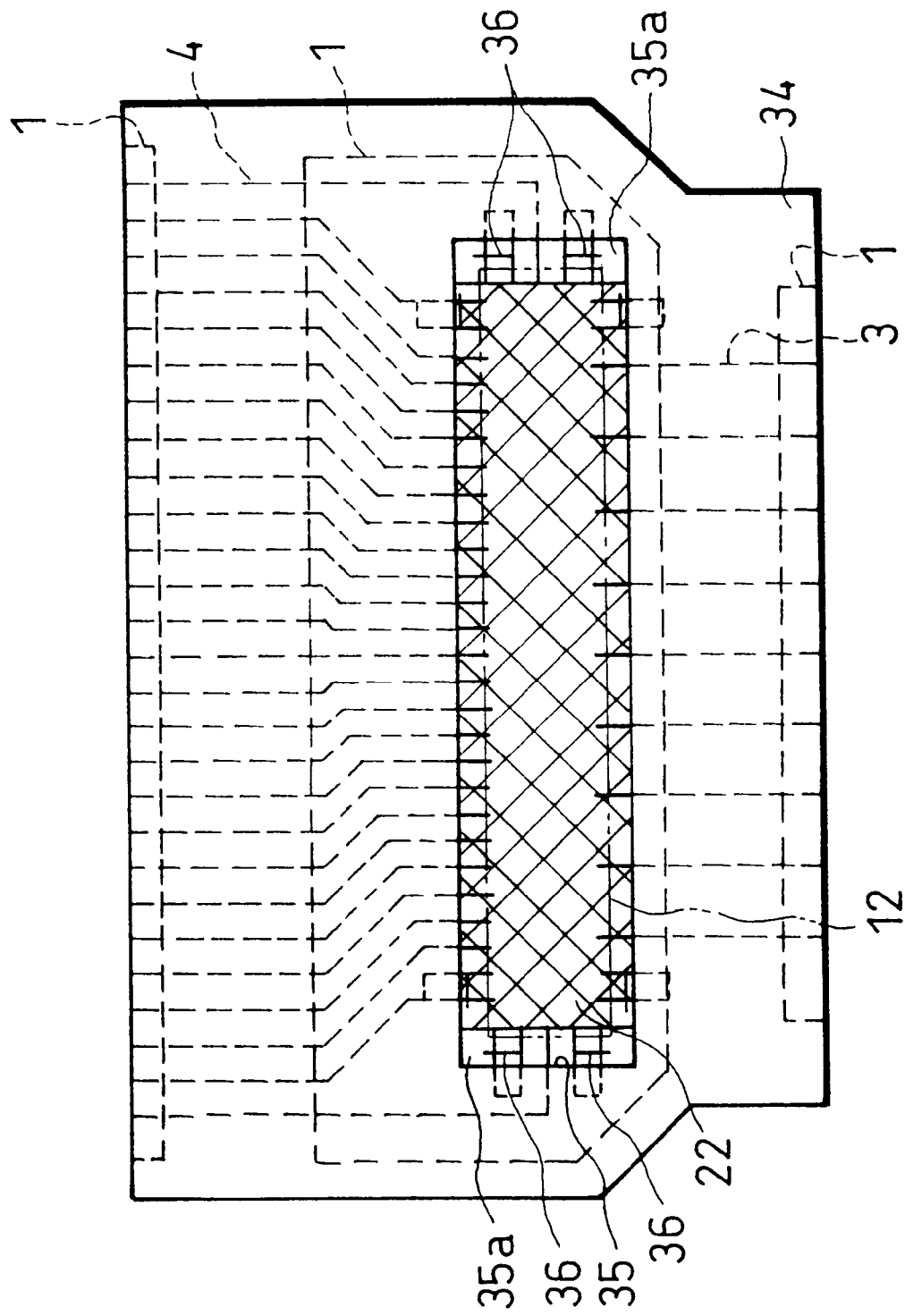
FIG. 11 is a bottom plan view of another film carrier employed in the semiconductor device of the present invention.

In order to prevent the anisotropic conductive resin 22 from blocking the alignment marks, other than the described method, it is possible to adopt an arrangement wherein the anisotropic conductive resin 22 partially covers the inner leads 2. For example, as shown in FIG. 11, both end portions 35a in the longitudinal direction of the device hall 35 of the insulating base material tape 34 are not covered with the anisotropic conductive resin 22 (region indicated by mesh in FIG. 11). This arrangement allows alignment marks 36, which have been provided beforehand when printing the inner leads 2, to be seen from the bottom side of the film carrier 13.

The alignment marks 36 may be used to precisely align the semiconductor chip 10 and the inner leads 2.

Figure 12:
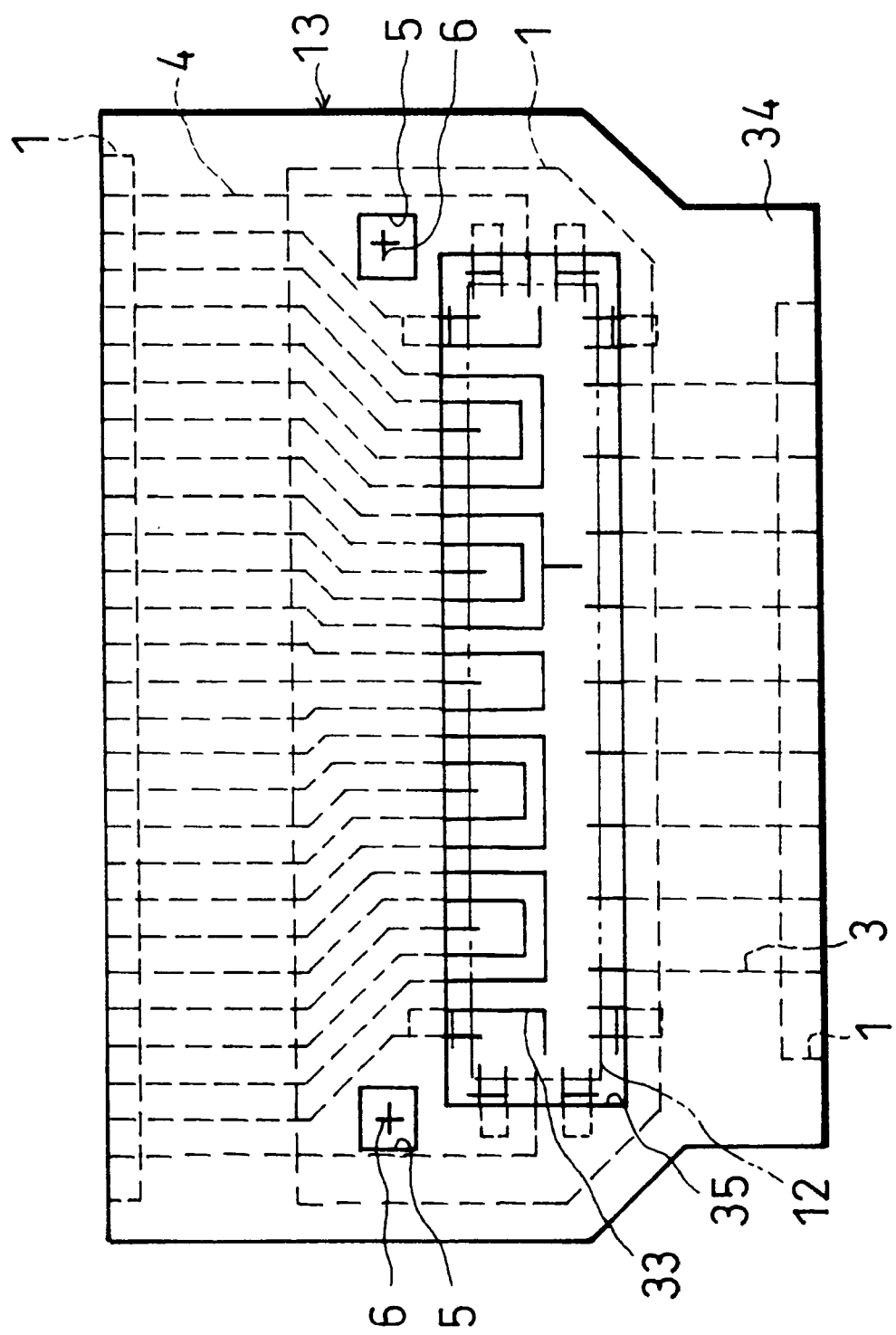
FIG. 12 is a bottom plan view of yet another film carrier employed in the semiconductor device of the present invention.
Figure 16:
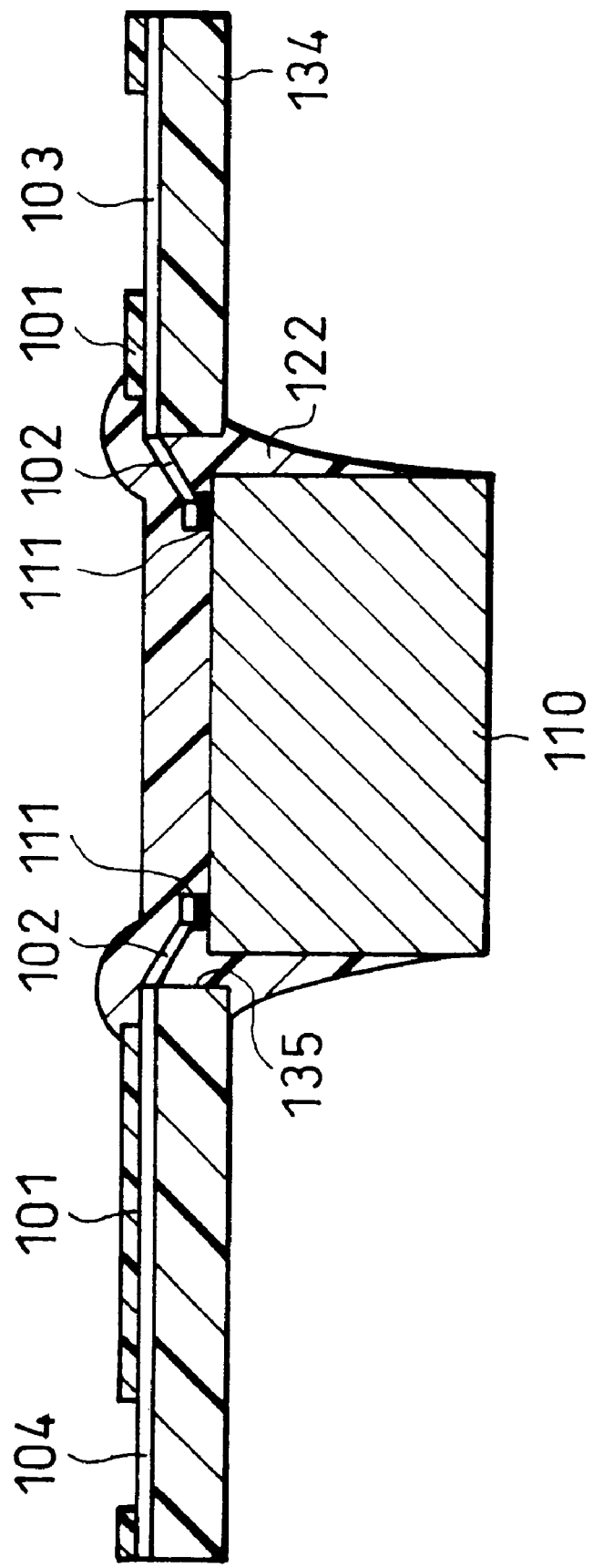
FIG. 16 is a schematic cross sectional view of a conventional s emiconductor device.
Figure 17:
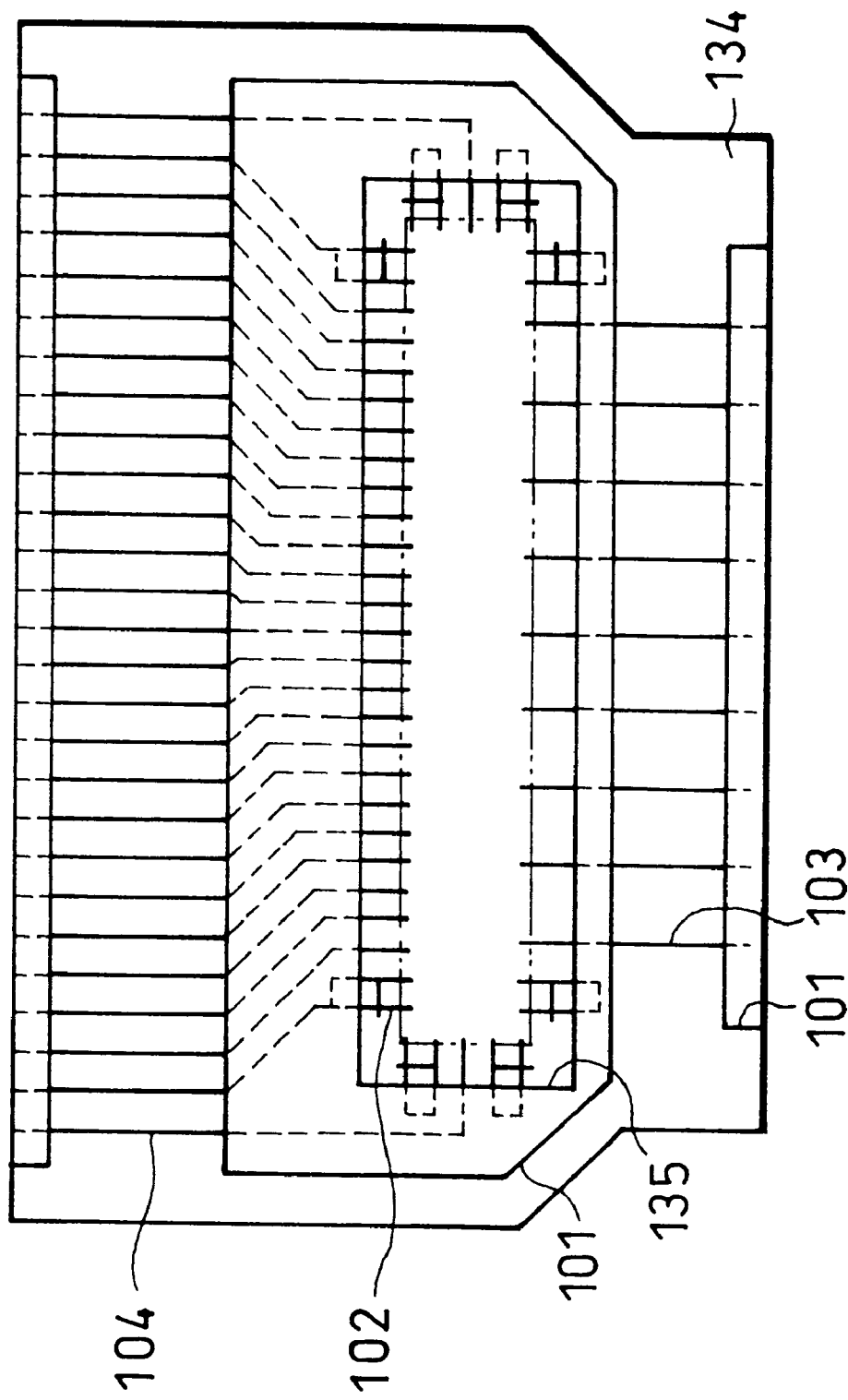
FIG. 17 is a plan view of a film carrier employed in the semiconductor device of FIG. 16.
Figure 18A:
FIG. 18(a) through FIG. 18(i) are explanatory drawings showing a manufacturing procedure of the film carrier of FIG. 16.
Figure 18B:
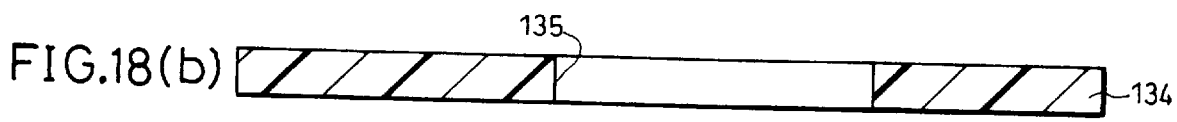
Figure 18C:
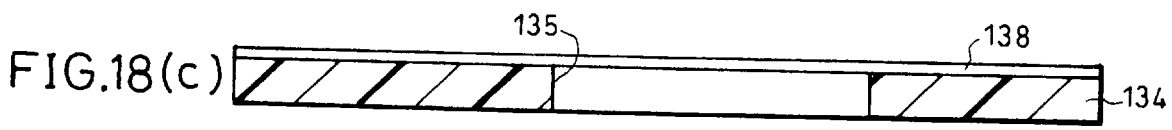
Figure 18D:
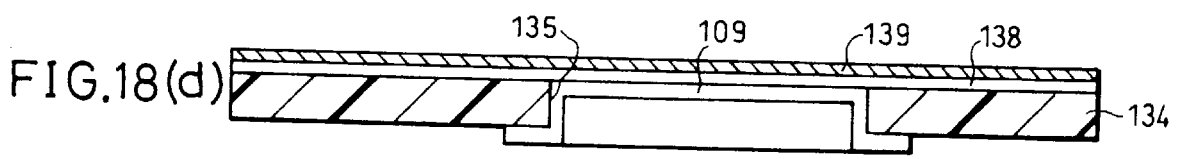
Figure 18E:
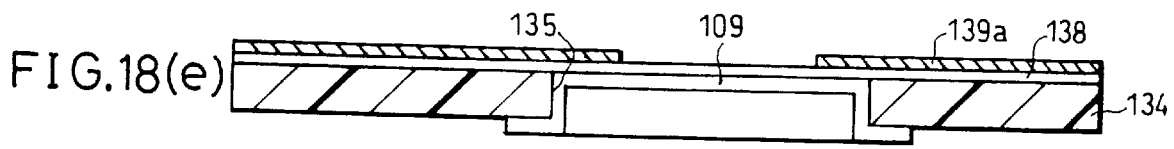
Figure 18F:
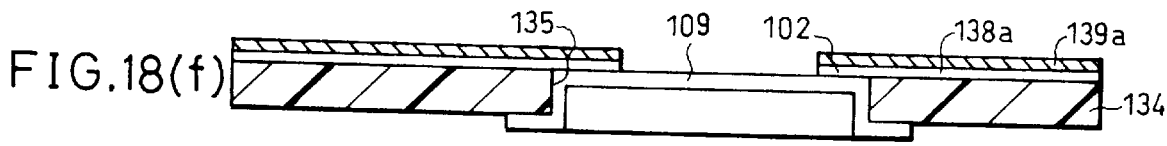
Figure 18G:
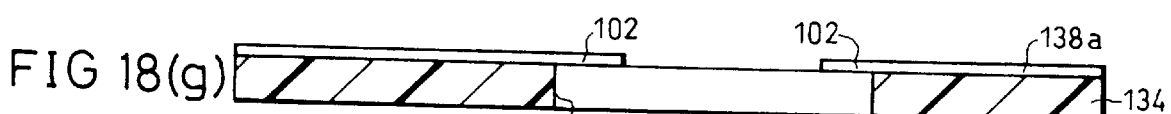
Figure 18H:
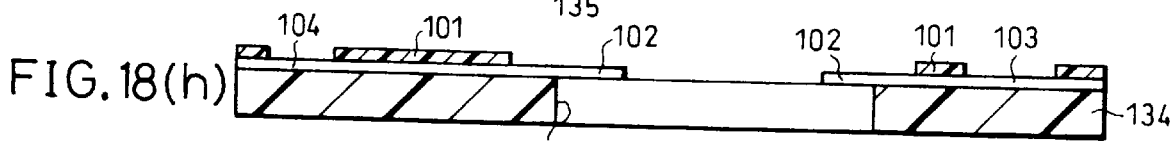
Figure 18I:
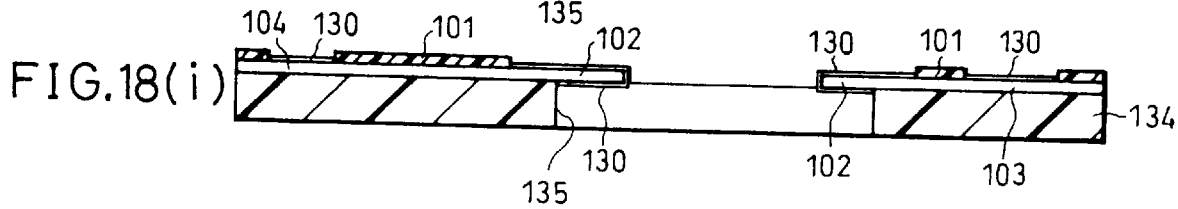
Figure 19:
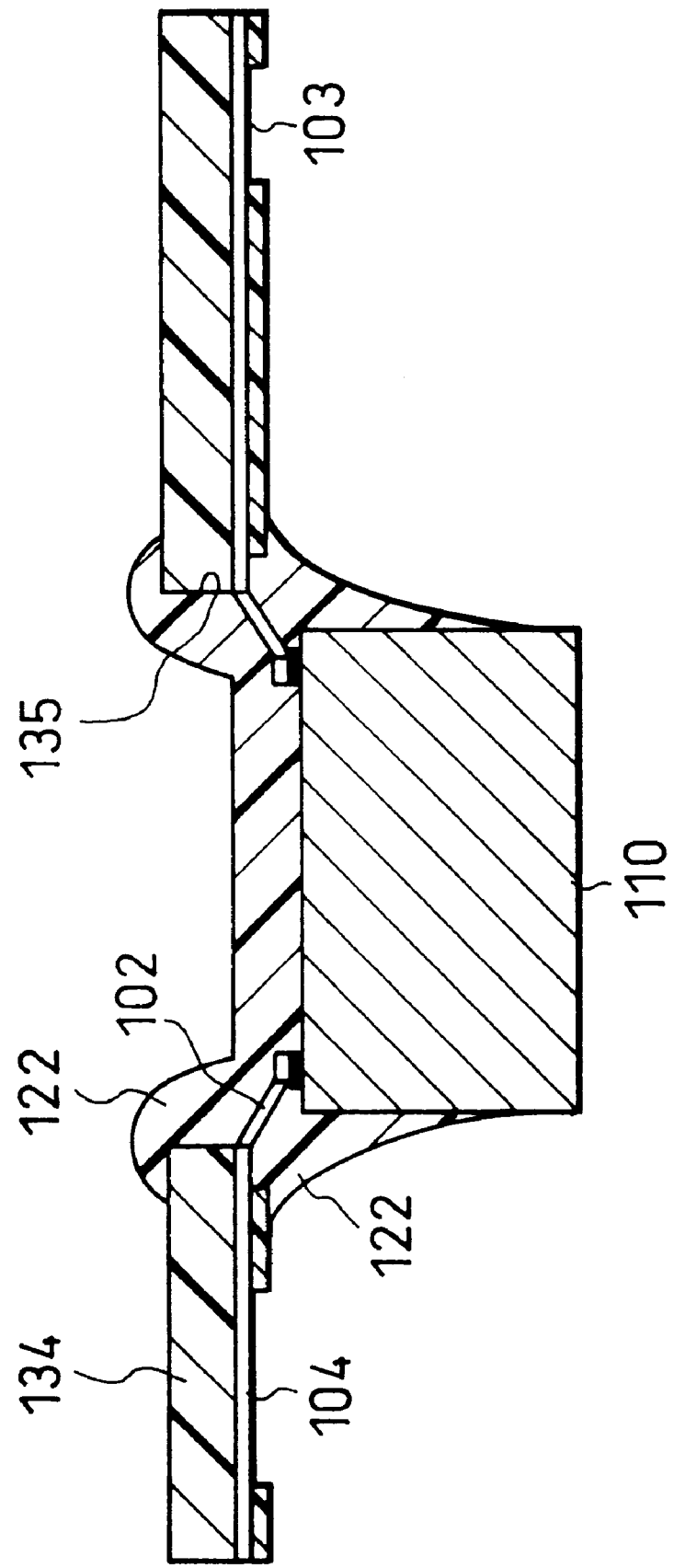
FIG. 19 is a schematic cross sectional view of another conventional semiconductor device.
Figure 20:
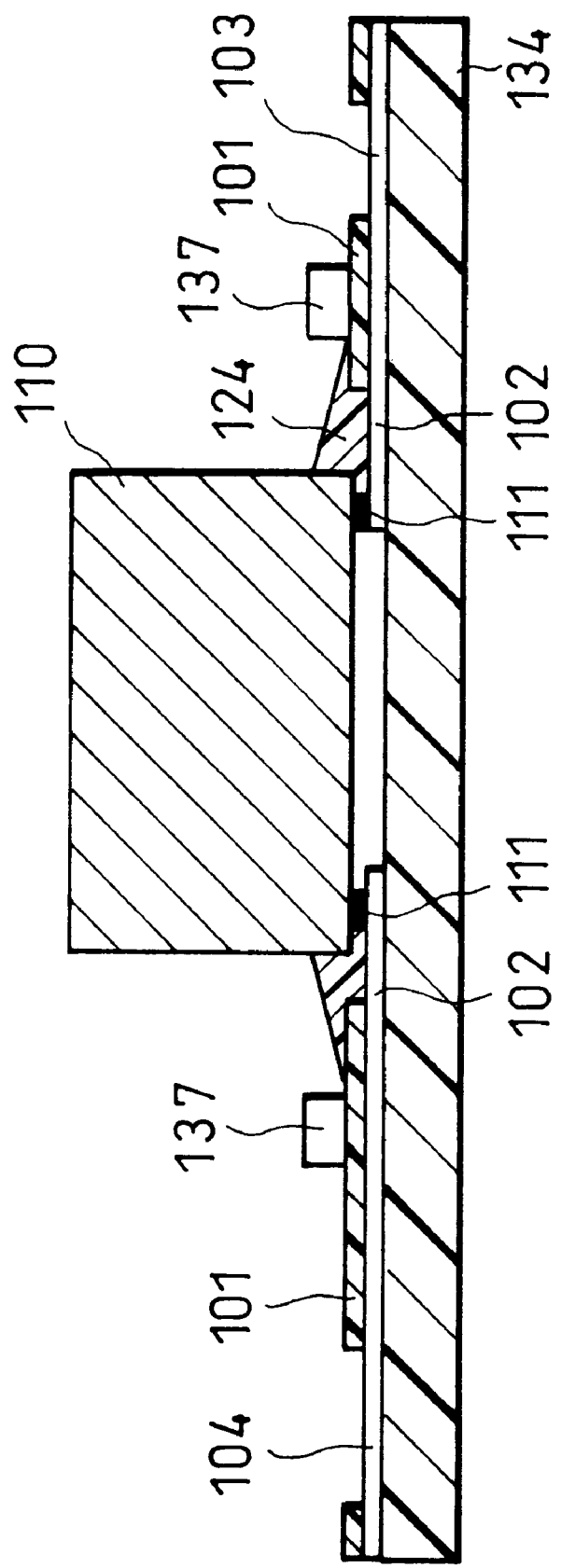
FIG. 20 is a schematic cross sectional view of yet another conventional semiconductor device.

In the film carrier 13 of the present embodiment, since the inner leads 2 are fixed so as to be supported by the organic insulating film 1, unlike the conventional arrangement wherein the inner leads are provided so as to project by a certain length from the device hall, the inner leads 2 can be provided more freely on a portion to be connected to the semiconductor chip 10. For example, as shown in FIG. 12, inner leads 33 may be adopted which extend towards the central portion of the ILB position.

As described, if the inner leads 2 can be provided more freely, it is possible to provide the bumps 11 provided on the semiconductor chip 10 on portions other than the peripheral edge portions of the combining surface of the semiconductor chip 10. This in turn allows the semiconductor chip 10 to be provided more freely. Thus, contrary to the conventional arrangement, it is not required to provide the bumps peripherally.

In recent years, the chip width of the semiconductor chip of the semiconductor device has been reducing. For example, a semiconductor chip having a chip width of substantially 0.7 mm has been produced, and the trend is expected to continue. Normally, the strength of the chip reduces in proportion to the reduction of the chip width.

However, in the semiconductor device of the present embodiment, for example, a semiconductor device having the arrangement of FIG. 1 has extremely high mechanical strength against cracking. Such high mechanical strength is achieved by the organic insulating film 1 and the insulating base material tape 34 which are provided on the semiconductor chip 10 and act as reinforcing materials of the semiconductor chip 10. Thus, according to the arrangement of the semiconductor device of the present embodiment, it is possible to adopt a semiconductor chip having a smaller chip width.

The following will explain a manufacturing method of a semiconductor device adopting the described film carrier (the film carrier 13 on which the inner leads 2 are supported by the organic insulating film 1).

First, as shown in FIG. 13(a) and FIG. 13(b), the film carrier 13 is fixed on a predetermined position on a tape fixing stage 42. Here, the device hall 35 of the film carrier 13 is provided with the anisotropic conductive resin 22 by printing. The film carrier 13 is fixed on the tape fixing stage 42 by the adhesion of adhesion pores 43 provided through the tape fixing stage 42.

The anisotropic conductive resin 22 is formed so as to have a size larger than the size of the semiconductor chip 10 to be combined with by the amount of 0 mm to 0.4 mm. This allows the anisotropic conductive resin 22, when combining with the semiconductor chip, to be squeezed out from the space between the semiconductor chip 10 and the film carrier 13 so as to cover the inner leads 2 which are not covered by the semiconductor chip 10. Note that, although the anisotropic conductive resin 22 is provided on the film carrier 13 by printing, the anisotropic conductive resin 22 may be provided by potting, or a seal-type anisotropic conductive resin 22 having a predetermined size may be attached to the film carrier 13 instead.

In the present embodiment, the anisotropic conductive resin 22 has a thickness which is 5 µm to 10 µm thicker than the total thickness of the copper foil (conductive wiring such as the inner leads 2) and the height of the bumps 11. In the present embodiment, the thickness of the copper foil is 15 µm, the height of the bumps 11 is 10 µm, and the thickness of the anisotropic conductive resin 22 is 35 µm.

Although the bumps 11 provided on the semiconductor chip 10 are electroplated with Au to the height of 10 µm, the bumps 11 are not limited to Au. Alternatively, it is possible to adopt a bump wherein a Ni-bump is formed by non-electroplating to the height of 5 µm, thereafter and Au is non-electroplated on the surface of the Ni-bump thus formed so as to have a thickness of 0.05 µm to 0.2 µm. The bump whose Ni surface is plated with Au in this manner could sufficiently combine the semiconductor chip 10 with the film carrier 13 via the anisotropic conductive resin 22.

Figure 5:
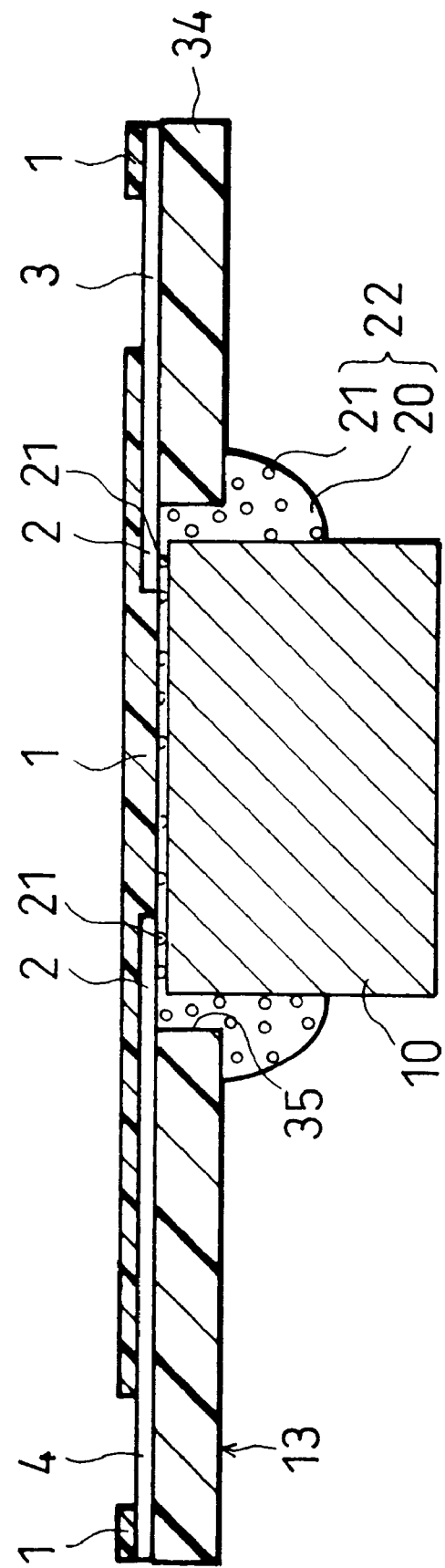
FIG. 5 is a schematic cross sectional view of a semiconductor device in accordance with the third embodiment of the present invention.

In the present embodiment, since the copper foil has a thickness of 15 µm, as shown in FIG. 5, the semiconductor chip 10 could be connected to the inner leads 2 without providing the bumps 11 on the semiconductor chip 10. In this case, a larger pressure is required in the ILB than in the case of providing the bumps on the semiconductor chip 10.

Further, as shown in FIG. 6, it is possible to connect the semiconductor chip 10 and the inner leads 2 to each other even if the bumps 11 are provided on the inner leads 2. In this case, the bumps 11 made of Au are formed on the inner leads 2 by a transfer bump forming method.

The ILB device for inner-lead-bonding the film carrier-type semiconductor device adopted in the present embodiment has an arrangement, although not shown, wherein the film carrier 13 which has been rolled up by a reel can be set to a loading section, and the film carrier 13 that has been subjected to the ILB is rolled up by a reel of an unloading section.

In the ILB device, as shown in FIG. 13(a) and FIG. 13(b), the side of the insulating base material tape 34 made of polyimide where the conductive wiring is provided is absorbed by the bonding pores 43 so that the film carrier 13 is fixed onto the tape fixing stage 42. FIG. 13(a) and FIG. 13(b) are enlarged drawings showing how the film carrier 13 of the ILB device is absorbed and fixed.

The film carrier 13 is set to the ILB device in the described manner.

Prior to setting the semiconductor chip to the ILB device, the semiconductor chip can be obtained by (1) attaching a wafer to a dicing sheet (not shown) and thereafter (2) dicing it by a dicing device. Here, the semiconductor chip is full-diced in order to avoid generation of silicon residue during the dicing.

The semiconductor chip thus diced is then set to a predetermined position of the ILB device, and the wiring pattern of each semiconductor chip thus diced is recognized by image processing. Then, a target semiconductor chip is lifted from below the dicing sheet by a lifting pin so as to be (1) detached from the dicing sheet and (2) absorbed by the absorbing collet simultaneously. Thereafter, the other side of the semiconductor chip thus absorbed is also absorbed by another absorbing collet (absorbing collet 40 of FIG. 13(a)).

The aluminium wiring pattern formed on the surface of the semiconductor chip in the described manner is recognized by a CCD camera or other devices.

Thereafter, as shown in FIG. 13(a), the semiconductor chip 10 thus absorbed by the absorbing collet 40 is moved upward in the ILB device, while the surface of the semiconductor chip 10 on which the aluminium wiring pattern is formed faces the film carrier 13. Also, the semiconductor chip 10 is absorbed by the suction through an absorbing pore 41 provided in the absorbing collet 40.

In FIG. 13(a), the fixed film carrier 13 is heated by the tape fixing table 42 to a temperature of substantially 80° C. so as to lower the viscosity of the anisotropic conductive resin 22 provided on the film carrier 13.

The semiconductor chip 10 absorbed by the absorbing collet 40 is aligned in accordance with the alignment marks provided on the film carrier 13 after the surface of the semiconductor chip 10 is recognized by image processing. The semiconductor chip thus aligned is then moved to the side of the film carrier 13 so as to be provisionally solderless-connected. In the provisional solderless-connecting, the anisotropic conductive resin 22 is heated by the tape fixing stage 42 to a temperature of substantially 80° C. for 3 seconds.

After the provisional solderless-connecting, the absorbing collet 40 is detached from the semiconductor chip 10, and as shown in FIG. 13(b), the semiconductor chip 10 is permanently solderless-connected to the film carrier 13 by the bonding tool 44 which has been heated to a predetermined temperature. Here, the process of permanent solderless-connecting takes 10 seconds. A surface 44a of the bonding tool 44 is covered with a diamond tool, and is heated so as to make the anisotropic conductive resin 22 to have a temperature in a range of 180° C. to 200° C. The load applied by the bonding tool 44 in the permanent solderless-connecting is preferably 2 kgf/chip to 8 kgf/chip.

In the case where the bonding tool 44 moves too fast in the permanent solderless-connecting, namely when the solderless-connecting operation time is short, it is likely that an unfilled void is formed between the semiconductor chip 10 and the film carrier 13. Thus, in the present embodiment, the bonding operation time by the bonding tool 44 is set to substantially 10 seconds so as to prevent the formation of the unfilled void between the semiconductor chip 10 and the film carrier 13.

In general, the anisotropic conductive resin 22 shows continuity in a direction the pressure is applied. Thus, as described, when the semiconductor chip 10 is pressed against the film carrier 13 by the bonding tool 44, continuity occurs between the bumps 11 of the semiconductor chip 10 and the inner leads 2 of the film carrier 13 conduct due to the conductive particles of the anisotropic conductive resin 22. A region of the anisotropic conductive resin 22 where no pressure is applied is insulated.

As the inner leads 2 and the semiconductor chip 10 are electrically connected via the conductive particles 21 of the anisotropic conductive resin 22, unlike the conventional arrangement, it is not required to form eutectic composed of tin plated on the inner leads section and gold formed on the semiconductor chip, thereby, unlike the conventional arrangement, not requiring a high temperature (500° C.) when connecting the inner leads 2 to the semiconductor chip 10. As a result, a flame does not generate when a CCD recognizes the state of connection between the inner leads 2 and the semiconductor chip 10, thereby improving the recognizing accuracy. Further, since the inner leads 2 and the semiconductor chip 10 are connected to each other at a low temperature, it is possible to suppress the thermal expansion and bending of the film etc., thereby greatly improving the alignment accuracy.

According to the above explanation, in the permanent solderless-connecting, the anisotropic conductive resin 22 is heated to 180° C. to 200° C. by the bonding tool 44 which has been heated to a predetermined temperature. However, in this case, because the heat from the bonding tool 44 transfers to the anisotropic conductive resin 22 through the semiconductor chip 10, the heat transfer is inefficient. The efficiency of heat transfer can be improved if the tape fixing stage 42 on which the film carrier 13 is provided is heated so as to heat the anisotropic conductive resin 22.

As described, in the case of heating the anisotropic conductive resin 22 by the tape fixing stage 42, during the provisional solderless-connecting, the anisotropic conductive resin 22 is heated to substantially 80° C. by the tape fixing stage 42. Therefore, it takes time to heat the anisotropic conductive resin 22 to a temperature in a range of 180° C. to 200° C. in the permanent solderless-connecting. If different tape fixing stages are used in the provisional solderless-connecting and the permanent solderless-connecting, respectively, it is possible to rapidly change the temperature of the anisotropic conductive resin 22 in accordance with the provisional solderless-connecting and the permanent solderless-connecting, respectively, thereby improving the manufacturing efficiency.

Conventionally, a resin sealing step for sealing resin in a portion where the semiconductor chip is combined with the film carrier is carried out after the semiconductor chip and the film carrier are combined with each other, namely the resin sealing step is carried out after the ILB step. However, according to the manufacturing step of the present embodiment, since the semiconductor chip and the film carrier are combined with each other via anisotropic conductive resin therebetween, the ILB step and the resin sealing step can be carried out simultaneously.

Further, since sealing resin is formed in the ILB step, it is not required to provide a separate step for post curing, thereby greatly saving the time for manufacturing the semiconductor device.

After the ILB, the semiconductor device is marked by either a mark printing machine or a laser marker (not shown).

The film carrier-type semiconductor device manufactured in the described manner is shipped to users in the form of a package rolled up by a reel.

Therefore, a user is required to stamp out the semiconductor device rolled up by the reel by using a mold so as to mount it on a liquid crystal module as shown in FIG. 3. Here, the output-side outer lead 4 of a semiconductor device 54 thus stamped out from the reel is connected by an anisotropic conductive bonding agent to the electrode 52c provided on the peripheral edge portion 52a of the liquid crystal panel 52. On the other hand, the input-side outer lead 3 is connected to the glass epoxy substrate 53 by the anisotropic conductive bonding agent or by soldering.

As described, in the present invention, due to the structure of the film carrier 13, namely due to the structure wherein the inner leads 2 are supported by the organic insulating film 1, the semiconductor chip 10 and the film carrier 13 are firmly combined with each other, thereby permitting the semiconductor chip 10 to be made smaller.

The following will explain a manufacturing method of the film carrier 13. Here, explanations will be given separately to the case where (1) a three-layered film carrier base material (insulating base material tape 34) is adopted as a material for the film carrier 13 and (2) a two-layered film carrier base material is adopted as a material for the film carrier 13.

First, a manufacturing method of the film carrier in the case of adopting the three-layered film carrier base material will be explained. Note that, as the three-layered film carrier base material, a polyimide film having a thickness of 75 µm and having a tape width of 35 mm is adopted. Also, a bonding agent having a thickness of substantially 12 µm is formed on the polyimide film.

The manufacturing method of the film carrier 13 in the case of adopting the three-layered film carrier base material includes at least the following three steps.

First Step: forming a device hall 35 (opening section) for mounting the semiconductor chip 10 on the insulating base material tape 34.

Second Step: forming conductive wiring on a main surface of the insulating base material tape 34 so patterned that the inner leads 2 project into the device hall 35.

Third Step: covering the conductive wiring, including the inner leads 2, with the organic insulating film 1 so as to support the inner leads 2.

More specifically, as shown in FIG. 14(a), first, the film carrier base material provided with the bonding agent (referred to as insulating base material tape hereinafter) 34 is stamped out by a mold so as to form the device hall as shown in FIG. 14(b), perforations and slits etc. (not shown) for film transfer.

Secondly, as shown in FIG. 14(c), copper foil 38 is provided on the side of the main surface of the insulating base material tape 34 where the device hall etc. are provided. The copper foil 38 is electrolytic copper foil having a thickness of 15 µm. Note that, 3 types of the copper foil are available, each having a thickness of 15 µm, 24 µm, and 36 µm from which an appropriate one is selected in accordance with the pitch of the inner leads. In the present embodiment, a semiconductor device having a pad pitch of 50 µm is adopted.

A laminating device (not shown) applies pressure and heat to the copper foil 38 so that the copper foil 38 is bonded to the insulating base material tape 34 via a bonding agent formed on the insulating base material tape 34.

Thirdly, as shown in FIG. 14(d), an etching resist 9 is printed on the device hall 35 from the opposite side of the insulating base material tape 34 surface on which the copper foil 38 is provided. As the etching resist 9, an organic resist is adopted which does not dissolve in an alkaline solution which will be used in the later-described steps for removing a photoresist.

Fourthly, as shown in FIG. 14(e), the copper foil 38 is coated with a photoresist 39 so as to be cured, and as shown in FIG. 14(f), the photoresist 39 is exposed and developed so as to form the wiring pattern on the insulating base material tape 34. Thereafter, as shown in FIG. 14(g), the copper foil 38 is etched with ferrous oxide so as to remove a portion which is not required, then the copper foil 38 is washed.

Fifth, as shown in FIG. 14(h), the photoresist 39 on the copper foil. 38 is removed with an alkaline solution. Since the etching resist 9 is made of the organic resist which does not dissolve in an alkaline solution, only the photoresist 39 on the copper foil 38 is removed.

Sixth, the organic insulating film 1, which acts as a solder resist, is printed on the copper foil 38 forming a predetermined wiring pattern. Here, various printing methods may be adopted. For example, liquid resin may be applied or thin film resin may be deposited. The organic insulating film 1 is printed in this manner so as to expose, as shown in FIG. 14(i), only respective portions of the copper foil 38 corresponding to the input-side outer lead 3, the output-side outer lead 4, and the inner leads 2. Here, the inner leads 2 are supported by the organic insulating film 1 so as to be fixed. Also, as the organic insulating film 1, since it is heated in the ILB, a highly heat resistant polyimide organic insulating film is adopted which is provided so as to have a thickness of 25 µm to 50 µm.

Seventh, as shown in FIG. 14(j), the etching resist 9 is dissolved in a solution so as to be removed. As the dissolving solution, DMF (dimethylform aldehyde), NMP (N-methylpyrrolidone), or other compounds is adopted.

Finally, as shown in FIG. 14(k), the tin 30 is non-electroplated on respective exposed portions of the inner leads 2, the input-side outer lead 3, and the output-side outer lead 4 so as to have a thickness of 0.4 µm to 0.7 µm. Here, as a preventive measure against generation of whisker, the plated tin 30 is cured for 1 hour to 2 hours at a temperature in a range of 110° C. to 140° C., thereby completing the film carrier 13.

The following will explain a manufacturing method of the film carrier in the case of adopting the two-layered film carrier base material. Note that, unlike the three-layered film carrier, the two-layered film carrier base material (insulating base material tape 34) does not have a structure wherein a bonding agent is laminated on the surface thereof.

The manufacturing method of the film carrier 13 adopting the two-layered film carrier base material includes at least the following three steps:

First Step: patterning conductive wiring, for mounting the semiconductor chip 10, on a main surface of the insulating base material tape 34.

Second Step: covering the conductive wiring thus patterned with the organic insulating film 1.

Third Step: forming the device hall 35 (opening section), for mounting the semiconductor chip 10, on the opposite surface of the insulating base material tape 34 surface where the conductive wiring is provided so as to expose the inner leads 2 while the inner leads 2 of the conductive wiring are being supported by the organic insulating film 1.

More specifically, as shown in FIG. 15(a), first, a main surface of the insulating base material tape 34 is covered with copper by spattering.

Secondly, as shown in FIG. 15(b), the photoresist 39 is applied to the insulating base material tape 34 thus covered with the copper, and the photoresist 39 thus applied is exposed such that the photoresist 39 remains on a portion other than the portion where a wiring pattern is to be formed.

Thirdly, as shown in FIG. 15(c), conductive wiring pattern 32 is formed by electrolysis. Namely, the thin copper 31 which has been covered as shown in FIG. 15(a) is thickened by electrolysis to the thickness substantially equal to the thickness of the photoresist 39 so as to form the conductive wiring pattern 32.

Fourthly, as shown in FIG. 15(d), the photoresist 39 and the copper 31 provided under the photoresist 39 are removed so as to print the organic insulating film 1 on the conductive wiring pattern 32 in the same manner as that shown in FIG. 14 (see FIG. 15(e)), thereby exposing the input-side outer lead 3 and the output-side outer lead 4 of the conductive wiring pattern 32.

Fifth, as shown in FIG. 15(f), the photoresist 39 is applied to the surface opposite to the insulating base material tape 34 surface where the wiring pattern is provided, and the photoresist 39 thus applied is exposed and developed so as to form the device hall 35 in the insulating base material tape 34.

Sixth, the insulating base material tape 34 is etched with an alkaline solution so as to form the device hall 35 (see FIG. 15(g)), thereby exposing the inner leads 2.

Seventh, the photoresist 39 is removed from the surface opposite to the insulating base material tape 34 surface where the conductive wiring pattern 32 is provided so as to obtain the film carrier of FIG. 15(h).

Finally, the tin 30 is non-electroplated on the exposed portions of the inner leads 2, the input-side outer lead 3, and the output-side outer lead 4 so as to have a thickness of 0.4 µm to 0.7 µm. Here, as a preventative measure against generation of whisker, the tin 30 thus plated is cured for 1 hour to 2 hours at a temperature in a range of 110° C. to 140° C., thereby completing the film carrier 13 of FIG. 15(i).

As described, it is possible to manufacture the film carrier-type semiconductor device of the present embodiment with the two-layered film carrier base material. However, in this case, a separate step is required such as the etching step for forming the device hall 35 on the surface opposite to the insulating base material tape 34 surface where the conductive wiring pattern 32 is provided. Therefore, the semiconductor device can be manufactured at a lower cost if the three-layered film carrier base material is adopted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device wherein a semiconductor chip is mounted on a film carrier, said film carrier being composed of an insulating base material tape having an opening section with said semiconductor chip disposed therein and a conductive wiring having an inner leads section electrically connected to said semiconductor chip in the opening section and extending into said openings to define an exposing surface, said conductive wiring being provided on a main surface of said insulating base material tape, wherein said film carrier is provided with an organic insulating film covering the conductive wiring and the inner leads section so as to support the inner leads section, and said organic insulating film covering an opening of the opening section on a side where the inner leads section is formed, said organic insulating film being provided so that a surface thereof facing said semiconductor chip is on a same level as said exposing surface of the inner leads section, and wherein sealing resin is provided between the organic insulating film and the semiconductor chip.

2. The semiconductor device as set forth in claim 1, wherein said sealing resin is anisotropic conductive resin.

3. The semiconductor device as set forth in claim 2, wherein said anisotropic conductive resin is composed of insulating sealing resin and conductive particles, the insulating sealing resin being made of thermosetting resin.

4. The semiconductor device as set forth in claim 3, wherein said conductive particles are plastic balls coated with metal.

5. The semiconductor device as set forth in claim 1, wherein the semiconductor chip and the inner leads section are connected to each other via bumps.

6. The semiconductor device as set forth in claim 5, wherein said bumps have a structure whose nickel layer is coated with gold.

7. The semiconductor device as set forth in claim 5, wherein said bumps are provided on the semiconductor chip.

8. The semiconductor device as set forth in claim 5, wherein said bumps are provided on the inner leads section.

9. The semiconductor device as set forth in claim 1, wherein at least one opening section is provided so as to penetrate through the organic insulating film, said opening section provided in a portion of the organic insulating film facing the semiconductor chip.

10. The semiconductor device as set forth in claim 1, wherein said semiconductor chip is covered with protective resin.

11. The semiconductor device as set forth in claim 1, wherein said organic insulating film is different from said insulating base material tape.

12. The semiconductor device as set forth in claim 1, wherein said organic insulating film seals the opening of the opening section on the side where the inner leads section is formed.

13. The semiconductor device as set forth in claim 1, wherein said organic insulating film integrally supports the inner leads section provided in plurality by covering the opening section.

14. The semiconductor device as set forth in claim 1, wherein said inner leads section is supported by the organic insulating film along the main surface of the insulating base material tape while exposing a surface facing the semiconductor chip.

15. A semiconductor device comprising:

a film carrier formed of an insulating base material tape having an opening section with an opening and a conductive wiring having an inner leads section with a pair of inner leads disposed facing each other and extending into said opening to define an exposing surface;

a semiconductor chip mounted on the film carrier in said opening section and being electrically connected to the inner leads section of the film carrier; and an organic insulating film provided on the tape carrier covering said opening of the openings section on a side where the inner leads section is formed so as to be on a same level as said exposing surface of the inner leads section, and said organic insulating film covering the conductive wiring and the inner leads section so as to support the inner leads section, wherein the organic insulating film is disposed between the pair of inner leads, and wherein sealing resin is provided between the organic insulating film and the semiconductor chip.

16. The semiconductor device as set forth in claim 15, wherein at least one opening section is provided so as to penetrate through the organic insulating film, said opening section provided in a portion of the organic insulating film facing the semiconductor chip.

17. The semiconductor device as set forth in claim 15, wherein the organic insulating film is disposed covering an opening of the opening section on a side where the inner leads section is formed.

18. A semiconductor device comprising:

a film carrier formed of an insulating base material tape having an opening section with an opening and a conductive wiring having an inner leads section with a pair of inner leads disposed facing each other and extending into said opening to define an exposing surface;

a semiconductor chip mounted on the film carrier in said opening section and being electrically connected to the inner leads section of the film carrier; and an organic insulating film provided on said film carrier covering said opening of the opening section on a side where the inner leads section is formed so as to be on a same level as said exposing surface of the inner leads section, and said organic insulating film covering the conductive wiring and the inner leads section so as to support the inner leads section, wherein sealing resin is provided between the organic insulating film and the semiconductor chip such that the sealing resin is sandwiched between the organic insulating film and the semiconductor chip.

19. A semiconductor device wherein a semiconductor chip is mounted on a film carrier, said film carrier being composed of an insulating base material tape having an opening section with said semiconductor chip disposed therein and a conductive wiring having an inner leads section electrically connected to said semiconductor chip in the opening section and extending into said opening to define an exposing surface, said conductive wiling being provided on a main surface of said insulating base material tape, wherein said film carrier is provided with an organic insulating film covering the conductive wiring and a first side of the inner leads section so as to support the inner leads section, and said organic insulating film covering an opening of the opening section on a side where the inner leads section is formed, said organic insulating film being provided so that a surface thereof facing said semiconductor chip is on a same level as said exposing surface of the inner leads section, and wherein said semiconductor chip is electrically connected to the inner leads section of the film carrier on a second side of the inner leads section opposite from the first side of the inner leads section, and a spacing between said semiconductor chip and the organic insulating film is sealed by sealing resin.

20. A semiconductor device comprising:

a film carrier that includes an insulating base material tape having an opening section with an opening, a conductive wiring having an inner leads section in the opening section, said inner leads section extending into said opening to define an exposing surface, said conductive wiring being provided on a main surface of said insulating base material tape, and an organic insulating film covering said opening of the opening section on a side where the inner leads section is formed so as to be on a same level as said exposing surface of the inner leads section, and said organic insulating film covering the conductive wiling and the inner leads section so as to support the inner leads section; and a semiconductor chip bonded to the opening section and disposed therein with a spacing between said semiconductor chip and the organic insulating film sealed by sealing resin while being electrically connected to the inner leads section of the film carrier.

* * * * *